US007253109B2

(12) United States Patent
Ding et al.

(10) Patent No.: US 7,253,109 B2
(45) Date of Patent: Aug. 7, 2007

(54) METHOD OF DEPOSITING A TANTALUM NITRIDE/TANTALUM DIFFUSION BARRIER LAYER SYSTEM

(75) Inventors: Peijun Ding, Saratoga, CA (US); Zheng Xu, Pleasanton, CA (US); Hong Zhang, Fremont, CA (US); Xianmin Tang, San Jose, CA (US); Praburam Gopalraja, San Jose, CA (US); Suraj Rengarajan, San Jose, CA (US); John C. Forster, San Francisco, CA (US); Jianming Fu, Palo Alto, CA (US); Tony Chiang, Campbell, CA (US); Gongda Yao, Fremont, CA (US); Fusen E. Chen, Saratoga, CA (US); Barry L. Chin, Saratoga, CA (US); Gene Y. Kohara, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/069,348

(22) Filed: Feb. 28, 2005

(65) Prior Publication Data

US 2005/0208767 A1 Sep. 22, 2005

Related U.S. Application Data

(63) Continuation-in-part of application No. 10/246,316, filed on Sep. 17, 2002, now Pat. No. 6,911,124, which is a continuation-in-part of application No. 10/146,416, filed on May 14, 2002, now abandoned, which is a continuation of application No. 09/770,934, filed on Jan. 25, 2001, now Pat. No. 6,458,255, which is a continuation of application No. 09/160,638, filed on Sep. 24, 1998, now abandoned, application No. 11/069,348, which is a continuation-in-part of application No. 08/995,108, filed on Dec. 19, 1997, now Pat. No. 6,887,353, and a continuation-in-part of application No. 10/796,602, filed on Mar. 8, 2004, now Pat. No. 6,919,275, which is a continuation of application No. 09/886,439, filed on Jun. 20, 2001, now Pat. No. 6,758,947, which is a continuation of application No. 08/978,792, filed on Nov. 26, 1997, now abandoned.

(51) Int. Cl.
*H01L 21/44* (2006.01)

(52) U.S. Cl. .............................. 438/685; 257/E21.168

(58) Field of Classification Search ................ 438/584, 438/597, 652, 653, 656, 674, 685; 257/E21.168
See application file for complete search history.

(56) References Cited

U.S. PATENT DOCUMENTS 3,437,864 A 4/1969 Kofoid et al. .............. 313/231

(Continued)

FOREIGN PATENT DOCUMENTS

DE 2110668 3/1971

(Continued)

OTHER PUBLICATIONS

E. D. Adams et al., J. Vac. Sci. Technol. A, vol. 3, No. 6, pp. 2264-2267 (Dec. 1985).

(Continued)

*Primary Examiner*—Scott B. Geyer
(74) *Attorney, Agent, or Firm*—Shirley L. Church

(57) ABSTRACT

We have discovered a method of providing a thin, approximately from about 2 Å to about 100 Å thick $Ta_N$ seed layer, which can be used to induce the formation of alpha tantalum when tantalum is deposited over the $Ta_N$ seed layer. Further, the $Ta_N$ seed layer exhibits low resistivity, in the range of 30 μΩcm and can be used as a low resistivity barrier layer in the absence of an alpha tantalum layer. In one embodiment of the method, a TaN film is altered on its surface to form the $Ta_N$ seed layer. In another embodiment of the method, a Ta film is altered on its surface to form the $Ta_N$ seed layer.

67 Claims, 5 Drawing Sheets

U.S. PATENT DOCUMENTS

| | | | |
|---|---|---|---|
| 3,491,000 A | 1/1970 | Fuls et al. | 205/198 |
| 3,607,384 A | 9/1971 | Banks | 117/215 |
| 3,616,452 A | 10/1971 | Bessot et al. | 204/298 |
| 3,619,403 A | 11/1971 | Gorin | 204/312 |
| 3,649,502 A | 3/1972 | Herte et al. | 204/192 |
| 3,699,034 A | 10/1972 | Lins et al. | 204/192 |
| 3,705,091 A | 12/1972 | Jacob | 204/312 |
| 3,819,976 A | 6/1974 | Chilton et al. | 315/3.5 |
| 3,873,884 A | 3/1975 | Gabriel | 315/267 |
| 3,875,068 A | 4/1975 | Mitzel | 250/531 |
| 3,878,079 A | 4/1975 | Schauer | 204/192 |
| 3,879,597 A | 4/1975 | Bersin et al. | 219/121 P |
| 4,000,055 A | 12/1976 | Kumagai | 204/192 |
| 4,036,708 A | 7/1977 | Feit et al. | 204/192.14 |
| 4,123,316 A | 10/1978 | Tsuchimoto | 156/643 |
| 4,233,109 A | 11/1980 | Nishizawa | 156/643 |
| 4,236,829 A | 12/1980 | Chikamura et al. | 257/183.1 |
| 4,319,264 A | 3/1982 | Gangulee et al. | 357/71 |
| 4,351,712 A | 9/1982 | Cuomo et al. | 204/192 |
| 4,362,632 A | 12/1982 | Jacob | 422/183.04 |
| 4,364,099 A | 12/1982 | Koyama et al. | 361/305 |
| 4,368,092 A | 1/1983 | Steinberg et al. | 156/345 |
| 4,379,832 A | 4/1983 | Dalal et al. | |
| 4,405,435 A | 9/1983 | Tateishi et al. | 204/298 |
| 4,407,712 A | 10/1983 | Henshaw et al. | 204/298 |
| 4,421,592 A | 12/1983 | Shuskus et al. | 156/613 |
| 4,431,898 A | 2/1984 | Reinberg et al. | 219/121 PG |
| 4,431,901 A | 2/1984 | Hull | 219/121 PR |
| 4,498,416 A | 2/1985 | Bouchaib | 118/719 |
| 4,514,437 A | 4/1985 | Nath | 427/39 |
| 4,545,115 A | 10/1985 | Bauer et al. | |
| 4,585,517 A | 4/1986 | Stemple | |
| 4,592,306 A | 6/1986 | Gallego | 118/719 |
| 4,607,593 A | 8/1986 | Van Hemel | 118/719 |
| 4,657,778 A | 4/1987 | Moran | 427/53.1 |
| 4,664,062 A | 5/1987 | Kamohara et al. | 118/719 |
| 4,668,338 A | 5/1987 | Maydan et al. | 156/643 |
| 4,668,365 A | 5/1987 | Foster et al. | 204/192.23 |
| 4,676,866 A | 6/1987 | Tang et al. | 156/643 |
| 4,681,773 A | 7/1987 | Bean | 118/719 |
| 4,683,043 A | 7/1987 | Melton et al. | 204/192.15 |
| 4,686,113 A | 8/1987 | Delfino et al. | 427/45.1 |
| 4,709,655 A | 12/1987 | Van Mastrigi | 118/50.1 |
| 4,715,921 A | 12/1987 | Maher et al. | 156/345 |
| 4,716,491 A | 12/1987 | Ohno et al. | 361/230 |
| 4,717,461 A | 1/1988 | Strahl et al. | 204/192.1 |
| 4,733,631 A | 3/1988 | Boyarsky et al. | 118/719 |
| 4,785,962 A | 11/1988 | Toshima | 220/260 |
| 4,792,842 A | 12/1988 | Honma et al. | 357/71 |
| 4,810,935 A | 3/1989 | Boswell | 314/111.41 |
| 4,820,106 A | 4/1989 | Walde et al. | 118/719 |
| 4,825,808 A | 5/1989 | Takahashi et al. | 118/719 |
| 4,844,775 A | 7/1989 | Keeble | 156/643 |
| 4,849,675 A | 7/1989 | Muller | 315/111.51 |
| 4,855,798 A | 8/1989 | Imamura et al. | 357/71 |
| 4,857,160 A | 8/1989 | Landau et al. | 204/192.12 |
| 4,859,908 A | 8/1989 | Yoshida et al. | 315/111.81 |
| 4,886,592 A | 12/1989 | Anderle et al. | 204/298 |
| 4,911,814 A | 3/1990 | Matsuoka et al. | 204/298 |
| 4,918,031 A | 4/1990 | Flamm et al. | |
| 4,944,961 A | 7/1990 | Lu et al. | 427/38 |
| 4,948,458 A | 8/1990 | Ogle | 156/643 |
| 4,951,601 A | 8/1990 | Maydan et al. | 118/719 |
| 4,976,839 A | 12/1990 | Inoue | 204/192.17 |
| 4,985,750 A | 1/1991 | Hoshino | 257/751 |
| 4,990,229 A | 2/1991 | Campbell et al. | 204/298.06 |
| 4,999,096 A | 3/1991 | Nihei et al. | 204/192.3 |
| 5,018,479 A | 5/1991 | Markunas et al. | 118/723 |
| 5,108,570 A | 4/1992 | Wang | 204/192.3 |
| 5,146,137 A | 9/1992 | Getsche et al. | 315/111.21 |
| 5,171,412 A | 12/1992 | Talieh et al. | 204/192.15 |
| 5,175,115 A | 12/1992 | Abe et al. | 427/10 |
| 5,178,739 A | 1/1993 | Barnes et al. | 204/192.12 |
| 5,186,718 A | 2/1993 | Tepman et al. | 29/25.01 |
| 5,221,449 A | 6/1993 | Colgan et al. | 204/192.15 |
| 5,225,740 A | 7/1993 | Ohkawa | 315/111.41 |
| 5,231,334 A | 7/1993 | Paranjpe | 315/111.21 |
| 5,236,868 A | 8/1993 | Nulman | |
| 5,240,880 A | 8/1993 | Hindman et al. | 438/656 |
| 5,246,885 A | 9/1993 | Braren et al. | |
| 5,281,485 A | 1/1994 | Colgan et al. | 204/192.15 |
| 5,281,854 A | 1/1994 | Wong | 257/740 |
| 5,302,266 A | 4/1994 | Grabarz et al. | 204/192.12 |
| 5,312,509 A | 5/1994 | Eschbach | 156/345 |
| 5,320,728 A | 6/1994 | Tepman | 204/192.12 |
| 5,330,628 A | 7/1994 | Demaray et al. | 204/192.12 |
| 5,338,423 A | 8/1994 | Hindman et al. | 204/192.12 |
| 5,354,443 A | 10/1994 | Moslehi | 204/192.12 |
| 5,354,712 A | 10/1994 | Ho et al. | |
| 5,358,616 A | 10/1994 | Ward | 204/192.15 |
| 5,371,042 A | 12/1994 | Ong | |
| 5,378,660 A | 1/1995 | Ngan et al. | |
| 5,391,517 A | 2/1995 | Gelatos et al. | 438/643 |
| 5,397,962 A | 3/1995 | Moslehi | 315/11.51 |
| 5,406,123 A | 4/1995 | Narayan | 257/767 |
| 5,430,355 A | 7/1995 | Paranjpe | 315/111.21 |
| 5,435,881 A | 7/1995 | Ogle | 156/345 |
| 5,464,711 A | 11/1995 | Mogab et al. | 430/5 |
| 5,478,455 A | 12/1995 | Actor et al. | 204/192.13 |
| 5,491,505 A | 2/1996 | Suzuki et al. | 347/203 |
| 5,514,908 A | 5/1996 | Liao et al. | 257/751 |
| 5,520,784 A | 5/1996 | Ward | 204/192.15 |
| 5,521,120 A | 5/1996 | Nulman et al. | 438/653 |
| 5,525,837 A | 6/1996 | Choudhury | 257/751 |
| 5,565,708 A | 10/1996 | Ohsaki et al. | 257/764 |
| 5,571,752 A | 11/1996 | Chen et al. | |
| 5,585,673 A | 12/1996 | Joshi et al. | 257/751 |
| 5,589,713 A | 12/1996 | Lee et al. | 257/773 |
| 5,643,834 A | 7/1997 | Harada et al. | |
| 5,658,438 A | 8/1997 | Givens et al. | 204/192.11 |
| 5,658,828 A | 8/1997 | Lin et al. | 438/643 |
| 5,676,587 A | 10/1997 | Landers et al. | 451/57 |
| 5,707,498 A | 1/1998 | Ngan | 204/192.12 |
| 5,723,367 A | 3/1998 | Wada et al. | |
| 5,725,739 A | 3/1998 | Hu | 204/192.3 |
| 5,780,357 A | 7/1998 | Xu et al. | 438/639 |
| 5,783,282 A | 7/1998 | Leiphart | 428/138 |
| 5,795,796 A | 8/1998 | Kim | 438/660 |
| 5,882,399 A | 3/1999 | Ngan et al. | 117/89 |
| 5,897,752 A | 4/1999 | Hong et al. | 204/192.12 |
| 5,933,753 A | 8/1999 | Simon et al. | 438/629 |
| 5,945,190 A | 8/1999 | Sato | 324/252 |
| 6,071,809 A | 6/2000 | Zhao | 438/622 |
| 6,139,699 A | 10/2000 | Chiang et al. | 204/192.15 |
| 6,287,977 B1 | 9/2001 | Hashim et al. | 438/722 |
| 6,291,880 B1 | 9/2001 | Ogawa et al. | 257/723 |
| 6,350,353 B2 | 2/2002 | Gopalraja et al. | 204/192.3 |
| 6,420,260 B1 | 7/2002 | Ngan et al. | 438/627 |
| 6,605,197 B1 | 8/2003 | Ding et al. | 204/192.15 |
| 6,758,947 B2 | 7/2004 | Chiang et al. | 204/192.12 |

FOREIGN PATENT DOCUMENTS

| | | |
|---|---|---|
| EP | 0146446 | 6/1985 |
| EP | 0157025 | 10/1985 |
| EP | 0244951 | 11/1987 |
| EP | 0272141 | 6/1988 |
| EP | 0346828 | 12/1989 |
| EP | 0407133 | 1/1991 |
| EP | 0421430 | 10/1991 |
| EP | 0451571 | 10/1991 |
| EP | 0489407 | 6/1992 |
| EP | 0570205 | 11/1993 |
| EP | 0644535 | 3/1995 |

| | | |
|---|---|---|
| EP | 0717436 | 6/1996 |
| EP | 0751566 | 1/1997 |
| EP | 0818556 | 1/1998 |
| EP | 0823279 | 2/1998 |
| GB | 1399603 | 7/1975 |
| GB | 2069230 | 8/1981 |
| GB | 2231197 | 11/1990 |
| JP | 58-056361 | 4/1983 ............ 204/192.15 |
| JP | 58-063139 | 4/1983 |
| JP | 59-186955 | 10/1984 |
| JP | 60-221572 | 11/1985 |
| JP | 61-170568 | 8/1986 |
| JP | 61-246381 | 11/1986 |
| JP | 62-116769 | 5/1987 |
| JP | 62-131455 | 6/1987 |
| JP | 62-152183 | 7/1987 |
| JP | 62-164875 | 7/1987 |
| WO | WO 86/06923 | 11/1986 |
| WO | WO 87/07309 | 12/1987 |
| WO | WO 97/04143 | 2/1997 |

OTHER PUBLICATIONS

S. Ahmad et al., Thin Solid Films, vol. 143, pp. 155-162 (1986).

M. E. Alperin, IEEE Transactions on Electron Devices, vol. ED-32, No. 2, pp. 141-149 (Feb. 1985).

G. Aston et al., "Ion Beam Divergence Characteristics of Two-Grid Accelerator Systems", AIAA Journal, vol. 16, No. 5, pp. 516-524 (May 1978).

G. Bomchil et al., Thin Solid Films, vol. 140, pp. 59-70 (1986).

R. Boswell et al., "Some Features of RF Excited Fully Ionized Low Pressure Argon Plasma", Physics Letters, vol. 91A, No. 4, pp. 163-166 (Sep. 1982).

P. Burggraaf, Ed., "Straightening Out Sputter Deposition", Semiconductor International, pp. 69-74 (Aug. 1995).

A. N. Campbell et al., "Relationship Between Texture and Electromigration Lifetime in Sputtered A1-1% Si Thin Films", Journal of Electronic Materials, vol. 22, pp. 589-596 (1993).

[5, 6] P. Catania et al., "Low resistivity body-centered cubic tantalum thin films as diffusion barriers between copper and silicon," J. Vac. Sci. Technol. A, vol. 10, No. 5, pp. 3318-3321 (Sep./Oct. 1992).

[2] B. Chin et al., "Barrier and seed layers for damascene copper metallization", Solid State Technology, pp. 141-145 (Jul. 1998).

[5, 6] J. C. Chuang et al., "Properties of the thin Ta-N films reactively sputtered on Cu/SiO2/Si substrates," Thin Solid Films, 322, pp. 213-217 (1998).

L. G. Feinstein et al., "Factors Controlling the Structure of Sputtered Tantalum Films," Thin Solid Films, vol. 16, pp. 129-145 (1973).

[2] K. Holloway et al., "Tantalulm as a Diffusion Barrier Between Copper and Silicon: Failure Mechanism and Effect of Nitrogen Additions", J. Appl. Phys., vol. 71, No. 11, pp. 5433-5444 (1992).

J. Hopwood et al., "Langmuir probe measurements of a radio frequency induction plasma", J. Vac. Sci. Technol. A, vol. 11, pp. 152-156 (1993).

N. S. Kim et al., "The effect of reactive-sputtered TiN on electromigration of Al alloy metallization", Proceedings IEEE VMIC Conference, vol. 104, p. 443 (Jun. 1995).

D. B. Knorr et al., "The role of texture in the electromigration behavior in pure aluminum films", J. Appl. Phys., vol. 79, pp. 2409-2417 (1996).

[6] T. Koikeda et al., "Temperature Coefficient of Tantalum Nitride Film Resistors," Electronics and Communications in Japan, vol. 53-C, No. 12, pp. 136-142 (1970).

S. Kordic et al., "Correlation between stress voiding of Al(Si)(Cu) metallizations and crystal orientation of aluminum grains", Journal of Applied Physics, vol. 74, pp. 5391-5394 (1993).

N. Kumar et al., "Growth and properties of radio frequency reactively sputtered titanium nitride thin films," J. Vac. Sci. Technol. A, vol. 5, No. 4, pp. 1778-1782 (Jul./Aug. 1987).

W. W. Macalpine et al., "Coaxial Resonators with Helical Inner Conductor", Issue of Proceedings of the IRE, pp. 2099-2105 (Dec. 1959).

[5] L. I. Maissel et al., "Handbook of Thin Film Technology", McGraw-Hill, Chapter 18, pp. 18-2-18-41. (1970).

A. Matsuzawa et al., Direct anodization of GaAs and Si at extremely low substrate temperature by low pressure oxygen plasma, J. Vac. Sci. Technol. pp. 793-795 (Jul./Aug. 1980).

S.-N. Mei et al., "Nonconformal Al via filling and planarization by partially ionized beam deposition for multilevel interconnection", IEEE Electron Device Letters, EDL-8, No. 10, pp. 503-505 (Oct. 1987).

K. Min et al., "Comparative study of tantalum and tantalum nitrides (Ta2 N and TaN) as a diffusion barrier for Cu metallization," J. Vac. Sci. Technol. B, No. 14, vol. 5, pp. 129-145 (Sep./Oct. 1996).

A. E. Morgan et al., Rapid Thermal Processing, MRS, pp. 279-287 (1986).

[6] L. J. Parfitt et al., "Origins of Residual Stress in Mo and Ta Films: The Role of Impurities, Microstructural Evolution and Phase Trasnformations," Mat. Res. Soc. Symp. Proc. vol. 436, pp. 505-510 (1997).

[6] R. Pinto et al., "Getter-Bias Sputtering of High Purity Metal Films in a High Current Vacuum Discharge in the $10^{-4}$ Torr Range", The Japanese Journal of Applied Physics, vol. 9. No. 2 (Feb. 1970).

D. Pramanik et al., "Barrier Metals for ULSI: Deposition and Manufacturing", Solid State Technology, pp. 73-82 (Jan. 1993).

S. M. Rossnagel et al., "Metal ion deposition from ionized magnetron sputtering discharge," J. Vac. Sci. Technol. B, vol. 12, No. 1, pp. 449-453 (1994).

[5] S. M. Rossnagel et al., "Thin, high atomic weight refractory film deposition for diffusion barrier, adhesion layer, and seed layer application", J. Vac. Scie. Technol. B 14(3), pp. 1819-1827 (May/Jun. 1996).

S. M. Rossnagel and J. Hopwood, "Magnetron sputter deposition with high levels of metal ionization", Appl. Phys. Lett., vol. 63, No. 24, pp. 3284-3287 (Dec. 1993).

S. M. Rossnagel, "Directional Sputter Deposition For Semiconductor Applications", Mat. Res. Soc. Symp. Proc., vol. 354, pp. 503-510 (1995).

S. M. Rossnagel, "Filling dual damascene interconnect structures with AlCu and Cu using ionized magnetron deposition", J. Vac. Sc. Technol. B, vol. 13, No. 1, pp. 125-129 (Jan./Feb. 1995).

S. M. Rossnagel, "Directional and preferential sputtering-based physical vapor deposition", Thin Solid Films, vol. 263, pp. 1-12 (1995).

N. Sakudo et al., "Microwave ion source", Review of Scientific Instruments, vol. 48, No. 7, pp. 762-766 (Jul. 1977).

[2] K. Sasaki et al., "Stoichiometry of Ta-N Film and its Application for Diffusion Barrier in the Al, Ta/Ta-N/Si Contact System", Japanese Journal of Applied Physics, vol. 29, No. 6, pp. 1043-1047 (1990).

[5, 6] T. Shioyama, "Stability improvement of TaN thin films used as resistive thermoconductive vacuum gauges", Journal of Vacuum science and Technology, pp. 1871-1873 (Jul./Aug. 1985).

C. Steinbrüchel, "Patterning of Copper for Multilevel Metallization: Reactive Ion Etching and Chemical-Mechanical Polishing," Applied Surface Science, 91, pp. 139-146 (1995).

[2] B. Sun et al., "PVD Ta and TaN, Diffusion Barriers and Deposition Techniques for Copper Metallization", Conference PRoceedings ULSI XIII, Materials Research Society, pp. 137-141 (1998).

T. Sugano, Ed., Applications of Plasma Processes to VLSI Technology, 1982-1985.

T. E. Tang et al., "Titanium Nitride Local Interconnect Technology for VLSI", IEEE Transaction on Electron Devices, vol. ED-34, No. 3, pp. 682-688 (Mar. 1987).

[2] E. M. Zielinski et al., "The Effects of Processing on the Microstructure of Copper Thin Films on Tantalum Barrier Layers", Mat. Res. Soc. Symp. Proc., vol. 391, pp. 303-308 (1995).

[5, 6] "Method for Controlling the Crystalline Phase of Tantalum", IBM Technical Disclosure Bulletin, vol. 32, No. 5A, pp. 42-43 (Oct. 1989).

"Dry Etching Systems: Gearing Up for Larger Wafers", Semiconductor International, pp. 48-60 (Oct. 1985).

METHOD OF DEPOSITING A TANTALUM NITRIDE/TANTALUM DIFFUSION BARRIER LAYER SYSTEM

This application is a continuation-in-part of U.S. patent application Ser. No. 10/246,316, filed Sep. 17, 2002, which is now U.S. Pat. No. 6,911,124; which is a continuation-in-part of U.S. patent application Ser. No. 10/146,416, filed May 14, 2002, which is abandoned; which is a continuation of U.S. patent application Ser. No. 09/770,934, filed Jan. 25, 2001, which issued as U.S. Pat. No. 6,458,255, on Oct. 1, 2002; which is a continuation of U.S. patent application Ser. No. 09/160,638, filed Sep. 24, 1998, which is abandoned. Application Ser. No. 10/246,316 is hereby incorporated by reference in its entirety. This application is also a continuation-in-part of U.S. patent application Ser. No. 08/995,108, filed Dec. 19, 1997, which is now U.S. Pat. No. 6,887,353. Application Ser. No. 08/995,108 is hereby incorporated by reference in its entirety. This application is also a continuation-in-part of U.S. patent application Ser. No. 10/796,602, filed Mar. 8, 2004, which is now U.S. Pat. No. 6,919,275; which is a continuation of U.S. patent application Ser. No. 09/886,439, filed Jun. 20, 2001, which issued as U.S. Pat. No. 6,758,947, on Jul. 6, 2004; which is a continuation of U.S. patent application Ser. No. 08/978,792, filed Nov. 26, 1997, which is abandoned. Application Ser. No. 10/796,602 is hereby incorporated by reference in its entirety.

BACKGROUND TO THE INVENTION

1. Field of the Invention

The present invention pertains to a method of depositing seed layers containing tantalum nitride, which induce the formation of alpha tantalum in a tantalum film which is deposited over the seed layer.

2. Brief Description of the Background Art

As microelectronics continue to miniaturize, interconnection performance, reliability, and power consumption has become increasingly important, and interest has grown in replacing aluminum alloys with lower resistivity and higher reliability metals. Copper offers a significant improvement over aluminum as a contact and interconnect material. For example, the resistivity of copper is about 1.67 $\mu\Omega$-cm, which is only about half of the resistivity of aluminum.

One of the preferred technologies which enables the use of copper interconnects is the damascene process. This process for producing a multi-level structure having feature sizes in the range of 0.25 micron ($\mu$m) or less typically includes the following steps: blanket deposition of a dielectric material over a substrate; patterning of the dielectric material to form openings; deposition of a diffusion barrier layer and, optionally, a wetting layer to line the openings; deposition of a copper layer onto the substrate in sufficient thickness to fill the openings; and removal of excessive conductive material from the substrate surface using chemical-mechanical polishing (CMP) techniques. The damascene process is described in detail by C. Steinbruchel in "Patterning of copper for multilevel metallization: reactive ion etching and chemical-mechanical polishing", *Applied Surface Science* 91 (1995) 139-146.

The preferred barrier layer/wetting layer for use with copper comprises a tantalum nitride/tantalum (barrier/wetting) layer having a decreasing nitrogen content toward the upper surface of the layer. This structure is described in applicants' copending application Ser. No. 08/995,108, filed Dec. 19, 1997. A barrier layer having a surface which is essentially pure tantalum or tantalum including only a small amount of nitrogen (typically less than about 15 atomic percent) performs well as a barrier layer and also as a wetting layer to enhance the subsequent application of an overlying copper layer.

Tantalum (Ta) metal has two crystalline phases: the low resistivity (12-20 micro-ohm-cm) alpha (body centered cubic or bcc) phase and a higher resistivity (160-170 micro-ohm-cm) beta (tetragonal) phase. Philip Catania et al. in "Low resistivity body-centered cubic tantalum thin films as diffusion barriers between copper and silicon", *J. Vac. Sci. Technol.* A 10(5), September/October 1992, describes the resistivity of thin bcc-tantalum films and $\beta$-tantalum films. The resistivity for bcc-tantalum ($\alpha$-tantalum) films is said to be on the order of 30 $\mu\Omega$-cm, while the resistivity of the $\beta$-tantalum films ranges from about 160 to 180 $\mu\Omega$-cm. A comparison of the effectiveness of thin bcc-Ta and $\beta$-Ta layers as diffusion barriers to copper penetration into silicon shows that the bcc-Ta which exhibits low resistivity also performs well as a barrier layer up to 650° C.

Kyung-Hoon Min et al. in "Comparative study of tantalum and tantalum nitrides ($Ta_2N$ and TaN) as a diffusion barrier for Cu metallization", *J. Vac. Sci. Technol.* B 14(5), September/October 1996, discuss tantalum and tantalum nitride films of about 50 nm thickness deposited by reactive sputtering onto a silicon substrate. The performance of these films as a diffusion barrier between copper and silicon is also discussed. The diffusion barrier layer performance is said to be enhanced as nitrogen concentration in the film is increased.

U.S. Pat. No. 3,607,384 to Frank D. Banks, issued Sep. 21, 1971, describes thin film resistors which utilize layers of tantalum or tantalum nitride. FIG. 1 in the '385 patent shows the resistivity for a particular tantalum nitride film as a function of the sputtering voltage and FIG. 2 shows the resistivity as a function of the nitrogen content of the film. The lowest resistivity obtained under any conditions was about 179 $\mu\Omega$-cm.

U.S. Pat. No. 3,878,079 to Alois Schauer, issued Apr. 15, 1975, describes and claims a method of producing thin tantalum films which are body-centered cubic lattices. The films are deposited upon a glass substrate, and FIG. 2 of the '079 patent shows resistivity for tantalum nitride films as a function of nitrogen content. U.S. Pat. No. 4,000,055 to Kumagai et al., issued Dec. 28, 1976, discloses a method of depositing nitrogen-doped beta-tantalum thin films. FIG. 2 of the '055 patent also shows the resistivity of the film as a function of the nitrogen content of the film.

In one method of generating an alpha-Ta film, the film is generated in a high density plasma. The cathode, which is made of tantalum, functions as a target. Tantalum species in the form of charged particles exiting the target pass through a nitrogen containing plasma and adhere on to the surface of the substrate. An alpha-Ta film is formed in this manner. However, the method, which involves small additions of nitrogen to the tantalum film in order to lower the resistivity of tantalum, is generally difficult to control. For more information on this process, please refer to Japanese Patent No. JP6154585 to Yoshida, issued Sep. 29, 1981.

U.S. Pat. No. 5,221,449 to Colgan et al., issued Jun. 22, 1993, describes a method of making alpha-tantalum thin films. In particular, a seed layer of Ta(N) is grown upon a substrate by reactive sputtering of tantalum in a nitrogen-containing environment. A thin film of $\alpha$-tantalum is then formed over the Ta(N) seed layer. In the Background Art section of the patent, reference is made to the "Handbook of Thin Film Technology", McGraw-Hill, page 18-12 (1970), where it is reported that if the substrate temperature exceeds 600° C., alpha phase tantalum film is formed. Further reference is made to an article by G. Feinstein and R. D. Huttemann, "Factors Controlling the Structure of Sputtered Tantalum Films", *Thin Solid Films*, Vol. 16, pages 129-145 (1973).

In another method for depositing an alpha tantalum film, a tantalum target is reactively sputtered into a nitrogen plasma to form a Ta(N) seed layer on a substrate. Subsequently, tantalum is sputter deposited over the Ta(N) seed layer to form alpha tantalum. The alpha tantalum is said to be formed when the atomic percent nitrogen in the plasma during deposition of the Ta(N) seed layer ranges from 0.3% to 35%, with the remainder being argon. For more information on this process, please refer to U.S. Pat. No. 5,281,485 to Colgan et al., issued Jan. 25, 1994.

A method of depositing an alpha-tantalum film on a semiconductor wafer by depositing a tantalum nitride film on a wafer is disclosed in (now abandoned) U.S. Patent Publication No. 2002/0142589 A1 of Sundarrajan et al., filed on Jan. 31, 2001, and assigned to the assignee of the present invention. This reference describes a method of depositing a tantalum nitride film on a wafer, and then depositing a tantalum film over the tantalum nitride with significant substrate biasing of about 100 W to about 500 W during the tantalum deposition. The tantalum film that is deposited is alpha phase.

As the feature size of semiconductor devices becomes ever smaller, the barrier/wetting layer becomes a larger portion of the interconnect structure. In order to maximize the benefit of copper's low resistivity, the diffusion barrier/ adhesion layer must be made very thin and/or must have low resistivity itself (so that it does not impact the effective line resistance of the resulting metal interconnect structure). As is readily apparent, depending on the device to be fabricated, various methods have been used in an attempt to develop a tantalum film which is a phase when lower resistivity is required. Typically, small additions of nitrogen have been made to tantalum films to lower the resistivity of the tantalum. Typically, the nitrogen is added by reactive sputtering during tantalum deposition, but this method is difficult to control, as any deviation in the nitrogen content of the plasma (even ±1 sccm of nitrogen flow) may lead to a significant increase in resistivity of the depositing film.

The prior art does not provide an effective method of depositing a seed layer consisting essentially of tantalum and a small amount of nitrogen, where the amount of nitrogen in the seed layer is carefully controlled. The present invention fulfills this long-standing need in the art.

SUMMARY OF THE INVENTION

We have developed methods of depositing low resistivity alpha tantalum films, by depositing tantalum over a seed layer of tantalum nitride ($Ta_N$) which is produced in a manner which provides better control over the nitrogen content in the seed layer. Since the seed layer is typically about 2-10 monolayers thick, it is difficult to obtain precisely the desired nitrogen content in the seed layer.

The methods involve producing a $Ta_N$ seed layer consisting essentially of tantalum with nitrogen in solution, where the $Ta_N$ seed layer contains a controlled amount of nitrogen that is about 33 atomic % or less of the overall composition. An embodiment method includes depositing a tantalum nitride film on a semiconductor substrate surface. The tantalum nitride film (TaN) may be deposited, for example and not by way of limitation, using chemical vapor deposition, standard sputtering, or reactive ion deposition sputtering. The thickness of a TaN layer typically ranges from about 10 Å to about 300 Å, depending on whether the semiconductor feature is a high aspect ratio contact or a trench of the kind used for multi-level interconnects. The tantalum nitride film surface is then bombarded with high energy species, while depositing tantalum over the tantalum nitride film surface. Reactive nitrogen species, which are released from the tantalum nitride film surface due to the high energy species bombardment, react with or are dissolved into the depositing tantalum to provide a $Ta_N$ seed layer having a specified nominal nitrogen content of less than about 33 atomic %. By controlling the plasma density and the voltage on the substrate surface, the bombardment of the high energy species is controlled, so that tantalum and nitrogen species are not sputtered off the TaN surface onto adjacent surfaces to any significant extent, but instead generally rise into the space above the TaN surface, where the nitrogen species contact and react with depositing tantalum species. The portion of the TaN film which is altered is typically less than 10% of the original TaN film thickness. This forms $Ta_N$ atoms, where the nitrogen content is controlled at a nominal value between about 5 atomic % and about 33 atomic %, and is typically less than about 25 atomic %. This $Ta_N$ settles down on the TaN surface forming a $Ta_N$ seed layer. After formation of at least two monolayers of the $Ta_N$ seed layer material, the subsequently depositing Ta is alpha-tantalum. The $Ta_N$ seed layer typically ranges from about 2 monolayers to about 10 monolayers, which typically provides a $Ta_N$ seed layer thickness ranging from about 2 Å to about 100 Å, more typically about 20 Å to about 100 Å. The thickness of the subsequently depositing alpha-Ta layer is typically about 60 Å or less, but is typically at least about 5 Å, so that copper deposited over the alpha-Ta layer will have a crystal orientation which resists electromigration.

In another embodiment of the method of forming a $Ta_N$ seed layer, a tantalum film is deposited on a semiconductor substrate surface, and then the surface of the Ta film is bombarded with high energy species while in contact with a nitrogen-containing plasma. The thickness of the Ta layer may range from about 5 Å to about 500 Å. Small amounts of reactive tantalum species, which are liberated from the tantalum film surface due to the high energy species bombardment, react with or trap nitrogen from a plasma present over the tantalum film surface, and redeposit on the tantalum film surface to provide a $Ta_N$ seed layer, having a nominal nitrogen content between about 5 atomic % and about 33 atomic %, and typically less than about 15 atomic %. After formation of at least two monolayers of $Ta_N$ seed layer material, nitrogen is removed from the plasma present over the $Ta_N$ seed layer surface. Tantalum subsequently deposited over the $Ta_N$ seed layer surface is alpha-tantalum. The $Ta_N$ seed layer typically ranges from about 2 monolayers to about 10 monolayers, which provides a $Ta_N$ seed layer thickness ranging from about 2 Å to about 100 Å, more typically about 20 Å to about 100 Å. The plasma density and the voltage on the substrate surface ate controlled so that the amount of energy transferred to the Ta film surface is sufficient to cause Ta species to rise into the space above the Ta film surface, where the nitrogen species from the plasma contact and react with the tantalum species. This forms $Ta_N$ atoms, and the $Ta_N$ atoms thus formed settle down on the Ta surface, forming a $Ta_N$ seed layer. Controlling the plasma density and the voltage on the substrate enables applicants to control the amount of energy that is transferred to the substrate and ensures that the transferred energy is sufficient to provide Ta species for reaction with nitrogen in the plasma, without sputtering Ta from the Ta film surface onto adjacent non-tantalum containing surfaces. In general, resputtering does not occur or is minimal; typically, less than 10% of the original Ta film thickness is altered.

Further, as an additional tool for controlling the nitrogen content in the $Ta_N$ seed layer, the nitrogen content of the plasma over the tantalum film surface during formation of the seed layer is controlled. The plasma source gas from which the plasma is generated contains about 10 volumetric % nitrogen to about 75 volumetric % nitrogen, with the remainder of the plasma source gas being an inert gas such as He, Ne, Ar, Xe, or Kr, by way of example and not by way of limitation.

Another embodiment of the invention is useful in forming contact vias. Specifically, a conformal layer of TaN is deposited on the surfaces of the via (defined in a dielectric layer). A conformal TaN layer is typically deposited using chemical vapor deposition techniques. In the alternative, a layer of TaN may be sputter deposited and then may be sculpted or resputtered to redistribute a portion of the TaN layer from the bottom of the via to redistribute on to the sidewalls of the via, thus thinning the TaN layer at the bottom of the via. This provides a more conformal layer over a feature surface. When the TaN layer is sculpted, additional TaN is resputtered for redistribution purposes. This is helpful when the thickness of the TaN layer at the bottom of the via is preferably 60 Å or less. Subsequently, the method of the invention described above, where the base (underlying) layer is a TaN layer, is used to produce a $Ta_N$ seed layer on the bottom of the contact via. Any tantalum deposited subsequently over the $Ta_N$ seed layer is alpha tantalum. Subsequent to deposition of the alpha tantalum layer, copper may be deposited over the alpha-tantalum layer, filling the via with the low electromigration copper, to provide a conductive interconnect over a dielectric layer surface.

Another aspect of the invention involves a method of forming a copper interconnect in a contact via where the initially deposited conformal layer is Ta rather than TaN. Specifically, a conformal layer of Ta is deposited on the surfaces of the via. Typically, the Ta layer is a conformal layer of Ta which is at least 5 Å thick. A conformal layer is commonly deposited using chemical vapor deposition techniques. In the alternative, sputter deposition of the Ta Layer may be used, where, depending on the thickness of the Ta layer at the bottom of the via, the Ta layer may be sculptured or resputtered, causing a portion of the Ta layer at the bottom of the via to redistribute onto the sidewalls of the via, thus thinning the Ta layer at the bottom of the via. The thickness of the Ta layer is preferably about 60 Å or less. The method of the invention described above with respect to a Ta base (underlying) layer is then used to produce a $Ta_N$ seed layer on the bottom of the via. Any tantalum subsequently deposited over the $Ta_N$ seed layer is alpha-tantalum. Copper may then be deposited over the alpha-tantalum barrier layer, thus filling the via with the electromigration copper to provide an interconnect over a dielectric layer.

Although the present method is described herein with respect to the formation of a TaN/$Ta_N$ barrier layer, the present method can also be used in the formation of barrier layers comprising other refractory metal nitride combinations, such as TiN/$Ti_N$, WN/$W_N$, and MoN/$Mo_N$, for example and not by way of limitation.

BRIEF DESCRIPTION OF THE DRAWINGS

FIG. 4A shows a schematic cross-sectional view of a structure including a substrate 403 (typically a dielectric material) containing a contact via 402.

FIG. 4B shows the structure 400 of FIG. 4A, where a conformal TaN layer 406 has been deposited over the surface of substrate 403.

FIG. 4C illustrates an alternative embodiment method of the invention (from the embodiment shown in FIG. 4C) where a plasma 407 is used to resputter (redistribute portions of a non-conformal TaN layer 406, redistributing TaN to sidewalls 404 of structure 400, and thinning a TaN layer 406 at the bottom 405 of contact via 402.

FIG. 4D shows a structure 400 of FIG. 4B or FIG. 4C after bombardment of a TaN layer 406 by high energy species 412 during the deposition of tantalum 416, to form a $Ta_N$ seed layer 420.

FIG. 4E shows the structure 400 of FIG. 4D after deposition of tantalum over $Ta_N$ seed layer 420 to form an alpha tantalum film 422, and after deposition of a copper fill layer 424 over alpha tantalum film 422.

FIG. 5A shows a schematic cross-sectional view of a structure 500 including a substrate 502 containing a contact via 504.

FIG. 5B shows the structure 500 of FIG. 5A after deposition of a conformal layer of tantalum 508 over the surface of contact via 504, including sidewalls 509 and the bottom 510 of contact via 504.

FIG. 5C shows an alternative structure 500, where the initial layer of tantalum deposited was not conformal and a portion of the tantalum layer has been resputtered to redistribute tantalum from the bottom 510 of via 504 onto the sidewall 509 of contact via 504. This provides a thinning of tantalum layer 508 at the bottom 510 of contact via 504, to produce a more conformal layer.

FIG. 5D shows the structure 500 of FIG. 5C, where the tantalum layer 508 at the bottom 510 of via 504 is bombarded with high energy species 518 from a plasma 516 including nitrogen. The bombardment lifts Ta 520 from the surface of tantalum layer 508, which interacts with the nitrogen.

FIG. 5E shows the structure 500 of FIG. 5D after formation of the Ta$_N$ seed layer 522 which results from the interaction of the nitrogen with Ta 520.

FIG. 5F shows the structure 500 of FIG. 5E after deposition of tantalum 524 over the surface of Ta$_N$ seed layer 522 to form an α tantalum layer 526.

FIG. 5G shows the structure 500 of FIG. 5F after deposition of a copper fill 528.

DETAILED DESCRIPTION OF THE PREFERRED EMBODIMENTS

Figure 1:
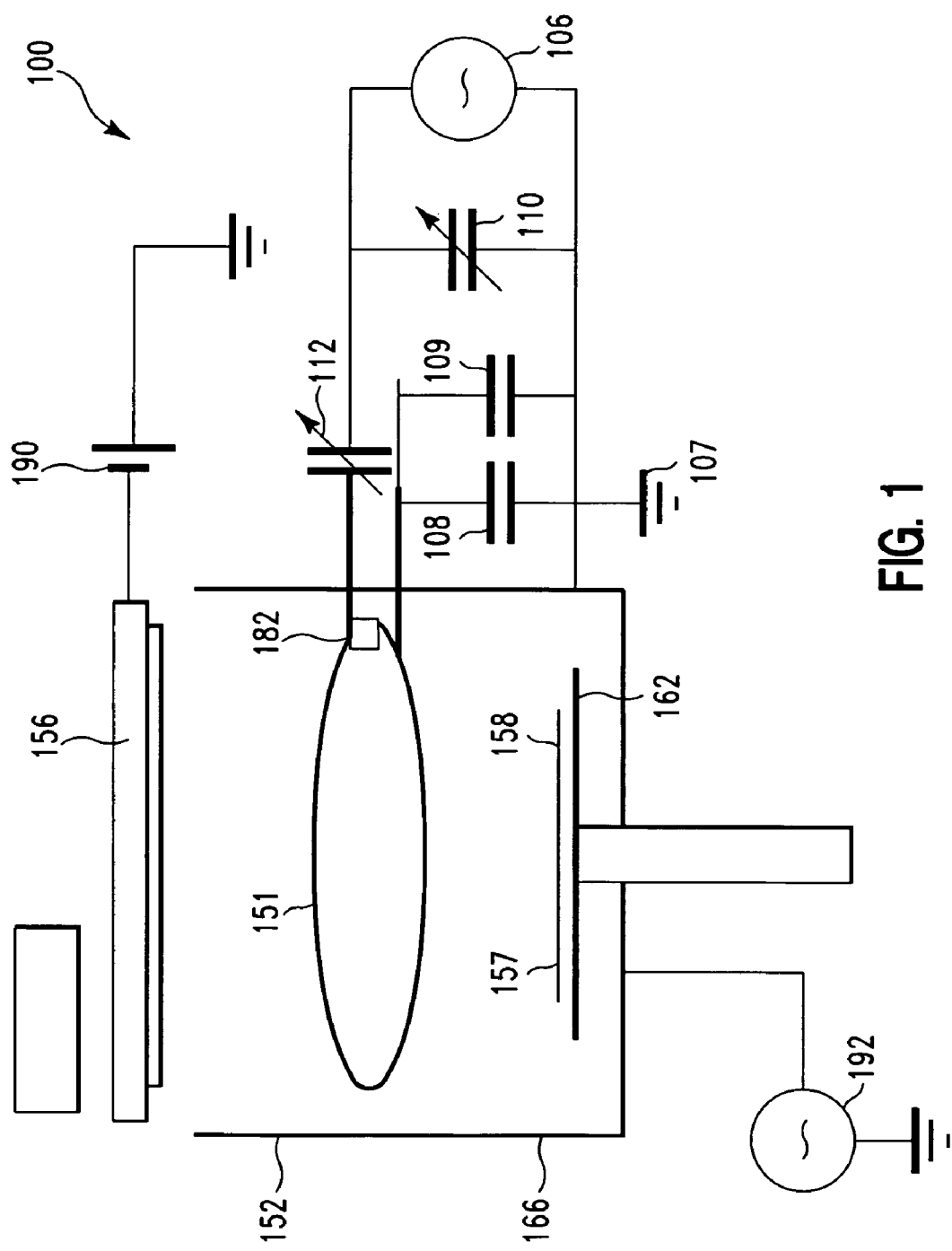
FIG. 1 is a schematic of the electrical connections of a sputtering process chamber of the kind which may provide improved control over sputtering process chamber elements, enabling the formation of the $Ta_N$ seed layer of the present invention.

This application is a continuation-in-part of U.S. patent application Ser. No. 10/246,316, filed Sep. 17, 2002, which is allowed but not yet issued; which is a continuation-in-part of U.S. patent application Ser. No. 10/146,416, filed May 14, 2002, which is abandoned; which is a continuation of U.S. patent application Ser. No. 09/770,934, filed Jan. 25, 2001, which issued as U.S. Pat. No. 6,458,255, on Oct. 1, 2002; which is a continuation of U.S. patent application Ser. No. 09/160,638, filed Sep. 24, 1998, which is abandoned. This application is also a continuation-in-part of U.S. patent application Ser. No. 08/995,108, filed Dec. 19, 1997, which is allowed but not yet issued. This application is also a continuation-in-part of U.S. patent application Ser. No. 10/796,602, filed Mar. 8, 2004, which is allowed but not yet issued; which is a continuation of U.S. patent application Ser. No. 09/886,439, filed Jun. 20, 2001, which issued as U.S. Pat. No. 6,758,947, on Jul. 6, 2004; which is a continuation of U.S. patent application Ser. No. 08/978,792, filed Nov. 26, 1997, which is abandoned. The disclosures of the above-listed applications are hereby incorporated by reference herein in their entireties.

We originally discovered a surprising and easy method for depositing ultra-low resistivity (about 10 μΩ-cm) tantalum films.

Deposition of a 1000 Å thick tantalum film using high density plasma or long-throw sputtering upon a silicon dioxide substrate, at a substrate support platen temperature of about 400° C. or higher (a substrate temperature of about 325° C. or higher), results in a tantalum film having a resistivity of about 10 μΩ-cm. (Deposition of thinner films under the same conditions provides the same low resistivity.) This is compared with a film resistivity of about 165 μΩ-cm obtained for a tantalum film sputtered upon a room temperature substrate. In addition, deposition of the tantalum film at room temperature, followed by a 15 minute anneal at a substrate temperature of either 350° C. or 550° C., produces a tantalum film having a resistivity of about 20 μΩ-cm.

We have also discovered that by adding a small amount of nitrogen to the sputtering chamber, to produce a Ta$_x$N$_y$ film where x is 1 and y ranges from about 0.5 to about 0.18, a Ta$_x$N$_y$ film having a resistivity of about 20 μΩ-cm can be obtained at even lower temperatures, particularly at a substrate temperature of about 275° C. or greater. This method is described in U.S. Pat. No. 6,458,255.

Although tantalum and tantalum nitride have gained industry acceptance as the barrier layer of choice for copper metallization, the difference in CMP polishing rate between copper and these materials causes problems in the damascene process for preparation of copper interconnect structures. The softer copper, which polishes more rapidly, tends to "dish", i.e., to be removed from an intended deposition area during the polishing period necessary for removal of excess barrier layer materials. We have discovered that the low resistivity α phase tantalum produced by the method of the present invention as described above, and by additional methods described below, shows a CMP rate that is superior to that of standard β phase tantalum, and more similar to that of tantalum nitride. This makes it possible to use tantalum as a barrier layer and to use thicker tantalum barrier layers for multi-level interconnect structures.

We have now discovered a straight forward method of producing an alpha-tantalum film beginning with a Ta$_N$ seed layer film, where the seed layer is produced in a manner so that the seed layer contains a controlled amount of nitrogen, which is typically in solution in a primarily tantalum composition. One embodiment of a method of forming the Ta$_N$ seed layer includes depositing a tantalum nitride (TaN) layer on a semiconductor substrate surface. The tantalum nitride film may be deposited, for example and not by way of limitation, using chemical vapor deposition, standard sputtering, or reactive ion deposition sputtering. The thickness of a TaN layer typically ranges from about 10 Å to about 300 Å, depending on whether the semiconductor feature is a high aspect ratio contact or a trench of the kind used for multi-level interconnects. The tantalum nitride film surface is then bombarded with controlled high energy species, to release a controlled amount of reactive nitrogen species from the tantalum nitride surface, and redepositing the nitrogen as part of a sputter depositing tantalum film. Any inert high energy species can be used to bombard the tantalum nitride film surface, provided that sufficient reactive nitrogen species are released from the TaN surface, and the crystalline structure of the depositing Ta$_N$ seed layer does not incorporate the inert atoms in a sufficient quantity that a tantalum film layer subsequently deposited over the Ta$_N$ seed layer does not form alpha tantalum. The deposited Ta$_N$ seed layer should be thick enough to create a crystal structure template. Typically, at least two (more typically, between two and ten) monolayers of the Ta$_N$ seed layer are required. The thickness of the Ta$_N$ seed layer thickness typically ranges from about 2 Å to about 100 Å, more typically about 20 Å to about 100 Å. The thickness of the subsequently depositing alpha-Ta layer is typically about 60 Å or less, but is typically at least about 5 Å, so that copper deposited over the alpha-Ta layer will have a crystal orientation which resists electromigration.

We have also developed another method of producing a Ta$_N$ seed layer film in a manner so that the film contains a controlled amount of nitrogen in a primarily tantalum composition. The method of forming the Ta$_N$ seed layer includes depositing a tantalum layer, and bombarding the deposited tantalum layer using high energy species having a controlled ion energy. The high energy species are supplied from a plasma containing a mixture of a noble gas (for example, and not by way of limitation) and nitrogen; bombardment of the tantalum layer generates displaced reactive tantalum species from the surface of the tantalum layer. The displaced tantalum species trap or react with nitrogen species from the plasma redepositing as a TaN layer. Typically, the plasma source gas used to generate the plasma contains about 10 volumetric % to about 75 volumetric % of nitrogen. The apparent optimum range for nitrogen is about 10 volumetric % to about 60 volumetric %. This embodiment of the method has the advantage that no tantalum nitride film of any significant thickness is formed in the film stack of a dual or single damascene structure, for example. This reduces the overall resistivity of electrical interconnects in the structure. The most widely used noble gas for high energy species bombardment is argon. The resistivity of the seed layer initially decreases as the nitrogen content increases. At a certain point the seed layer resistivity plateaus at a low point, prior to increasing upon further addition of nitrogen. This plateau is generally where a subsequently deposited tantalum film will be alpha tantalum. Ideally, the $Ta_N$ seed layer contains between 5 atomic % and 33 atomic % nitrogen. The apparent optimum atomic % of nitrogen in a $Ta_N$ seed layer is less than about 25%.

Another embodiment of the invention teaches depositing an alpha-tantalum barrier/liner layer within a via which is defined in a dielectric layer. When an initially deposited TaN conformal layer is thicker than desired, it may be necessary to thin the TaN layer prior to carrying out the present invention, so that the final resistivity of the contact structure is not higher than desired. For example, a conformal layer of TaN is conformally deposited over the surface of a contact via. The conformal TaN layer is typically deposited using chemical vapor deposition techniques. In order to reduce the thickness of the TaN layer at the bottom of the via, the TaN layer may resputtered using ions from a plasma. The TaN layer is resputtered at the bottom of the via, with material resputtered on to the sidewall of the via, thus thinning the TaN layer at the bottom of the via.

Subsequently, the method of the invention described above with respect to a TaN underlying layer is used to produce a $Ta_N$ seed layer on the bottom of the via. Then, tantalum is deposited over the $Ta_N$ seed layer to form alpha-tantalum. The $Ta_N$ seed layer typically ranges from about 2 monolayers to about 10 monolayers, which provides a $Ta_N$ seed layer thickness ranging from about 2 Å to about 100 Å, more typically about 20 Å to about 100 Å. A layer of copper is deposited on top of the alpha tantalum layer, filling the via, and forming a conductive interconnect within a dielectric layer. The diffusion of copper into the dielectric layer is prevented by the alpha-tantalum barrier layer at the bottom and the tantalum nitride layer on the side walls.

Another embodiment of the invention includes a method of forming a Cu interconnect in a via defined in dielectric layer, where the initially deposited conformal layer is Ta rather than TaN. The method includes depositing a conformal tantalum layer over the upper surface of the dielectric layer, covering the side walls and the base of the via. Depending on the thickness of the conformal Ta layer, the base of the via may be resputtered using a plasma in order to thin the tantalum layer. The resputtering causes redistribution of tantalum layer materials from the via base to the tantalum layer that coats the sidewalls of the via. Then, the method of the invention described above with respect to a Ta underlying layer is used to produce a $Ta_N$ seed layer on the bottom of the via. A tantalum layer subsequently deposited over the $Ta_N$ seed layer will be alpha-tantalum. In order to form a conductive feature within the dielectric layer, copper is subsequently deposited over the alpha-tantalum layer, to fill the via with copper. The tantalum layer and the alpha tantalum layer form a barrier layer which prevents the copper layer from diffusing into the dielectric layer.

A more detailed description of the ultra-low resistivity tantalum films and methods for their deposition is presented below. Although the embodiments described in the examples below pertain to the formation of a TaN/$Ta_N$ barrier layer, it is contemplated that the general method of the invention can be used in the formation of barrier layers comprising other refractory metal nitride combinations, such as TiN/$Ti_N$, WN/$W_N$, and MoN/$Mo_N$, for example and not by way of limitation I. Definitions As a preface to the detailed description, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor.

Specific terminology of particular importance to the description of the present invention is defined below.

The term "about", as used herein, refers to a value or range which may encompass plus or minus 10% of a particular cited value or range.

The term "aspect ratio" refers to, but is not limited to, the ratio of the height dimension to the width dimension of particular feature. When the feature has more than one width dimension, the aspect ratio is typically calculated using the smallest width dimension of the feature. For example, a contact via opening which typically extends in a tubular form through multiple layers has a height and a diameter, and the aspect ratio would be the height of the tubular divided by the diameter. The aspect ratio of a trench would be the height of the trench divided by the minimal width of the trench, which typically occurs at its base.

The term "copper" includes, but is not limited to alloys of copper of the kind typically used in the semiconductor industry. The preferred embodiments described herein are with reference to a copper alloy comprising about 98% by weight copper, but the invention can be used in combination with other conductive materials which exhibit a substantially smaller copper content. For example, the invention can be used where the metallization layer comprises aluminum-copper alloys, where the copper content is typically less than about 4 weight %, and aluminum-copper-silicon alloys, where the copper content is typically about 0.5 weight %.

The term "decoupled plasma source" refers to a plasma generation apparatus which has separate controls for power input to a plasma source generator and to a substrate bias device. the plasma source controller controls the supply of inductively coupled RF power which determines plasma density (source power) and the bias controller controls the supply of RF power or DC power which is used to generate a DC bias voltage on the semiconductor substrate surface (bias power). The bias voltage affects the high energy species bombardment energy on the substrate surface. This decoupled plasma source typically incorporates measures to separate (decouple) the influence of the source power and bias power on one another. The ENDURA® metal deposition system and CENTURA® metal etch system available from Applied Materials, Inc. of Santa Clara, Calif. which includes decoupled plasma source power and bias power control are referred to as "DPS" systems. Similar equipment available from other manufacturers may be referred to by different nomenclature.

The term "feature" refers to, but is not limited to, contacts, vias, trenches, and other structures which make up the topography of the substrate surface.

The term "high density plasma sputter deposition" or "ion plasma deposition" or "IMP sputter deposition" refers to, but is not limited to, sputter deposition, preferably magnetron sputter deposition (where a magnet array is placed behind the target), where a high density plasma is created using the application of inductively coupled RF power which is typically applied to a coil which is positioned between the sputtering cathode and the substrate support electrode. This arrangement provides an increased portion of the sputtered emission is in the form of ions at the time it reaches the substrate surface. In high density plasma deposition, the electron density is typically at least $10^{11}$ $e^-/cm^3$. A preferred apparatus for high density plasma sputter deposition is the ENDURA® "IMP" metal deposition system.

The term "reactive ion deposition" or "reactive ion metal plasma" refers to ion-deposition sputtering wherein a reactive gas is supplied during the sputtering to react with the ionized material being sputtered, producing an ion-deposition sputtered compound containing the reactive gas element.

The term "seed layer" refers to ($Ta_N$) a layer that is being deposited to have a particular crystalline structure so that a given crystalline structure can be induced in a layer deposited over the surface of the seed layer.

The term "SEM" refers to a scanning electron microscope.

The term "traditional sputtering" or "standard sputtering" refers to a method of forming a film layer on a substrate wherein a target is sputtered and the material sputtered from the target passes between the target and the substrate to form a film layer on the substrate, and no means is provided to ionize a substantial portion of the target material sputtered from the target before it reaches the substrate. One apparatus configured to provide traditional sputtering is disclosed in U.S. Pat. No. 5,320,728, the disclosure of which is incorporated herein by reference. In such a traditional sputtering configuration, the percentage of ionized target material which reaches the substrate is less than 10%, more typically less than 1%, of that sputtered from the target.

The term "tantalum film" refers to a film wherein at least 98 atomic % of the film is tantalum.

The term $Ta_N$ refers to a specialized tantalum film, useful as a seed layer, and as a low resistivity barrier layer, where the tantalum film contains minor amounts of nitrogen in solution, such that the nitrogen content ranges from about 5 atomic % to about 33 atomic %. Typically, $Ta_N$ seed layer contains about 25 atomic % nitrogen or less.

II. An Apparatus for Practicing the Invention

Figure 6:
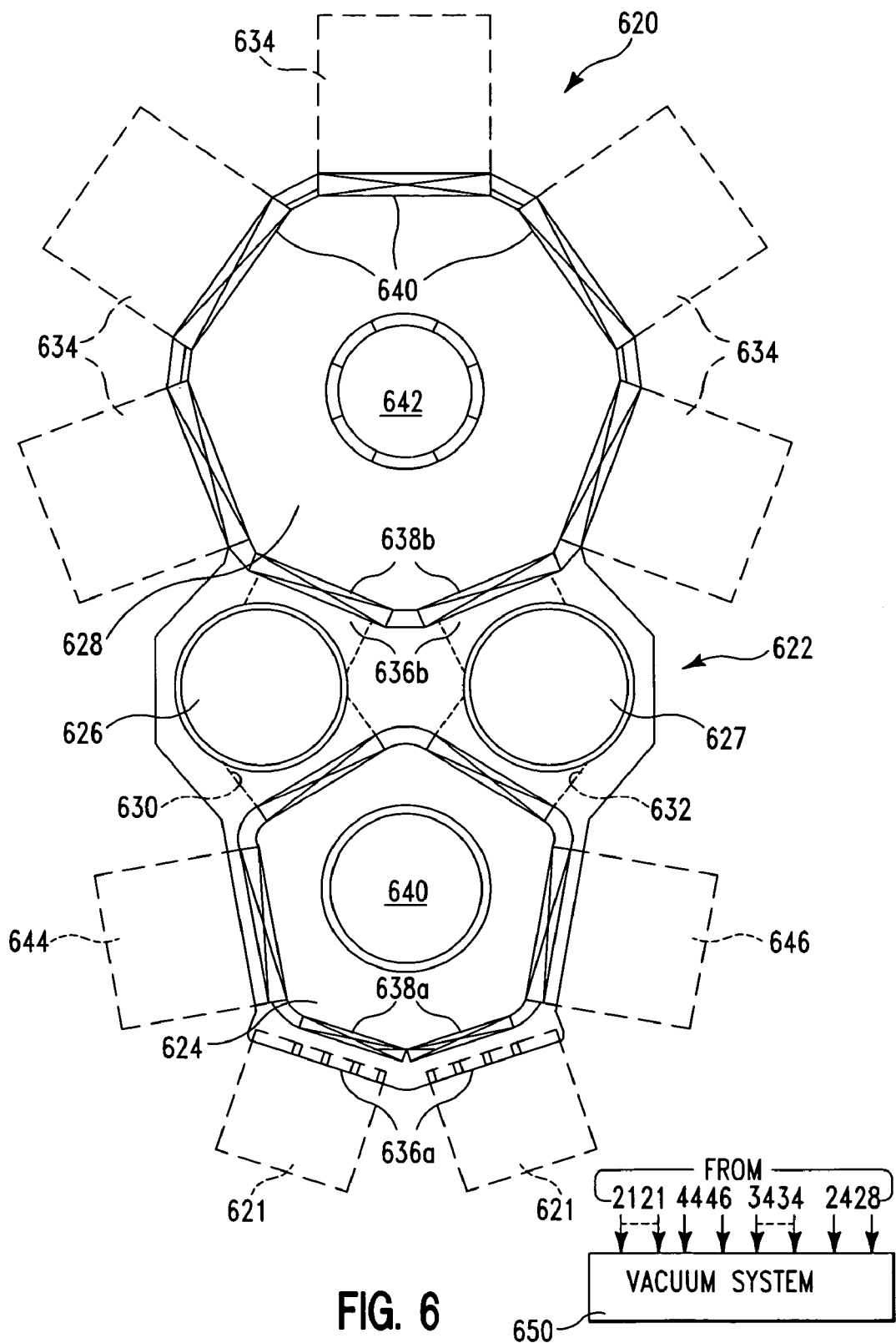
FIG. 6 is a schematic of a top plan view of a staged-vacuum, multiple chamber semiconductor wafer processing system 620 of the kind which may be used to produce the TaN, Ta, Ta$_N$, and Cu layers described above, as well as TiN, Ti, Ti$_N$, and Al layers, and WN, W, and W$_N$ layers, by way of example.

The barrier layer deposition methods of the present invention may be carried out in a CENTURA® or in an ENDURA® integrated processing system available from Applied Materials, Inc. (Santa Clara, Calif.). The ENDURA® system is a multiple chamber, staged vacuum semiconductor wafer processing system, which allows the performance of different deposition steps in separate chambers, while substrates are passed through a protected environment from chamber to chamber. The ENDURA® system is shown in FIG. 6 and described in U.S. Pat. No. 5,186,718, the disclosure of which is hereby incorporated by reference herein in its entirety.

FIG. 6 is a schematic top plan view of the configuration of a multiple chamber, staged vacuum wafer processing system 620. The system 620 shown in FIG. 6 includes a housing 622 which defines four main chamber areas: a robot buffer chamber 624 at one end, a transfer robot chamber 628 at the opposite end, and a pair of intermediate processing or treatment chambers 626 and 627. Although one or more load-lock chambers 621 may be used, preferably two such chambers 621 are mounted to the robot buffer chamber 624, and are in communication with the interior of the buffer robot chamber 624 via access ports 636a and associated slit valves 638a. A plurality of vacuum processing chambers 634 (illustratively five) are mounted about the periphery of the transfer robot sation 628. The vacuum processing chambers 634 may be adapted for various types of processing, including etching and/or deposition processes. Access from intermediate processing or treatment chambers 626 and 627 to transfer robot chamber 628 is provided via access ports 636b and associated slit valves 636b. Access is provided to and between each of the chambers 634 and transfer robot chamber 628 through a gate valve 640.

In more detail, the buffer robot chamber 624 and transfer robot chamber 628 communicate with one another via the intermediate processing or treatment chambers 626 and 627 (also called "treatment chambers"). Specifically, intermediate treatment chamber 626 is located along a corridor or pathway 630 which connects the transfer robot chamber 628 to the buffer robot chamber 624. Similarly, the second intermediate treatment chamber 627 is located along a separate corridor or pathway 632 which connects transfer robot chamber 628 with buffer robot chamber 624. These separate paths between the two robot or transfer chambers 624, 628, permit one path to be used for loading or unloading while the system is being used for wafer processing and, thus, provide increased wafer throughput. Please note that chambers 626 and 627 can be dedicated to pre-treatment (e.g., plasma etch cleaning and/or heating) of the wafers before processing in chambers 634 or post-treatment (e.g., cool-down) of the wafers following treatment in chambers 634. Alternatively, one or both of the chambers 626 and 627 can be adapted for both pre-treatment and post-treatment.

Preferably, the housing 622 is a monolith, i.e., it is machined or otherwise fabricated from one piece of material (such as aluminum) to form the four chamber cavities 624, 626, 627, and 628, and the interconnecting corridors or pathways 630 and 632. The use of the monolith construction facilitates alignment of the individual chambers for wafer transport and also eliminates difficulties in sealing the individual chambers.

One typical operational cycle of wafer transport through the system 620 is as follows: Initially, an RΘ buffer robot 640 in chamber 624 picks up a wafer from a cassette load-lock 621 and transports the wafer to a chamber 626, which illustratively etch cleans the surface of the wafer. An RΘ transfer robot 642 in chamber 628 picks up the wafer from the pre-cleaning chamber 626 and transfers the wafer to a selected one of the preferably high-vacuum processing chambers 634. Following processing, transfer robot 642 can transfer the wafer selectively to one or more of the other chambers 634 for processing. Then, following use of this random access-type transfer capability, the transfer robot 642 transfers the wafer to intermediate processing chamber 627, which illustratively is a cool-down chamber. After the cool-down cycle, buffer robot 640 retrieves the wafer from the chamber 627 and returns it to the appropriate cassette load-lock chamber 621.

As alluded to above, the system 620 is uniquely designed so that each chamber stage (main processing chambers 634/transfer robot chamber 624/intermediate processing chambers 626 and 627/buffer robot chamber 624/load-lock chambers 621) can be isolated from all the other chambers. None of the chambers or stages, with the exception of the cassette load-lock(s) 621, is vented to atmosphere during processing. In addition, during wafer transfer, only two adjacent chambers need to be in communication at any time. As a result, variations in vacuum level and, specifically, reductions in the vacuum level during wafer transfer can be minimized by using a vacuum pumping system 650 to provide a vacuum gradient across the system from the cassette load-lock 621 to the vacuum processing chambers 634. The staged vacuum is applied across the system, with the degree of vacuum increasing in order from the cassette load-locks 621 to the processing chambers 634. Consequently, the time required to pump down chamber 634 to its base vacuum level subsequent to the loading of a wafer therein is minimized, and very high degrees of vacuum can be used in the processing chambers 634 without lengthy pump-down times and, thus, without adversely affecting system throughput. Also, since the wafers can be pre-cleaned and/or pre-heated before entering high vacuum, there is less system contamination and throughput is increased.

In addition to the enhanced vacuum isolation, throughput, and processing versatility provided by an intermediate stage chamber of the kind illustrated as 626 and 627, the above-mentioned stations or chambers 644 and 646 can be mounted on the buffer robot chamber 624 to provide still additional processing isolation, flexibility, and throughput enhancement. For example, chamber 644 may be an orienter which is used to orient the wafer flats prior to processing. Alternatively, an entire cassette of wafers in load-lock chamber 621 may be oriented one at a time preparatory to transfer to the processing chambers. Chamber 646 may also be dedicated to pre-processing treatment. Alternatively, one or both of the chambers 644 and 646 may be used for post-processing treatment, for both pre-processing and post-processing treatment, or for processing itself. These chambers 644 and 646 are very effectively isolated from the processing chambers 634 by the intervening individually isolated buffer chamber 624, transport paths 626 and 627 (and associated chambers), and transfer chamber 628. Thus, chambers 644 and 646 can be conveniently used for processes which require a different (and/or incompatible) chemistry and/or different (typically lower) pressure relative to the group of processing chambers 634. For example, the high degree of isolation facilitates the use of corrosive gas chemistry in the chambers 634 without affecting the atmosphere and processing/treatment in the chambers 644, 646, and vice versa.

One particular process chamber of the kind which could be used as chamber 634 in the above description and which permits improved control over the ion energy during high energy species bombardment of a substrate is a DC magnetron type processing chamber such as an ENDURA® ENCORE™ physical vapor deposition (PVD) processing chamber available from Applied Materials, Inc. (Santa Clara, Calif.). This process chamber is described in detail in PCT Application No. WO 03/056603, which was filed on Dec. 10, 2002, and assigned to the assignee of the present invention, the disclosure of which is hereby incorporated by reference in its entirety.

FIG. 1 is a schematic representation of internal elements and the electrical connections of a sputtering chamber of the kind described above with reference to an ENDURA® ENCORE™ PVD processing chamber. FIG. 1 illustrates a system 100 which includes a process chamber 152, typically fabricated from aluminum and electrically grounded. The system 100 further includes a target 156 having at least a surface portion composed of a material to be sputter deposited on a substrate 158. The substrate 158 may vary in size and is typically a wafer including 150, 200, 300 and 450 mm wafer sizes. The illustrated system 100 is capable of self induced plasma (SIP) sputtering in a long-throw mode. This SIP sputtering may be used to provide nonconformal sputter deposition over the surface of a semiconductor feature, primarily directed to the sidewalls of a via structure.

In addition, the illustrated system 100 can be used to provide careful control of the energy of high energy species used to bombard a substrate surface in general. The system 100 has an internal RF coil 151 which inductively couples RF energy into the interior of the reactor. The RF (coil) energy is typically used to increase the energy input into sputtered target material from target 156 as the sputtered material passes by the coil 151. This increase in the energy content of sputtered target material, combined with a bias on the substrate, may be used to increase the bottom coverage of sputter deposited target material on the bottom of a semiconductor substrate feature such as a contact via. Coil 151 may be constructed from a material which is the same as the target 156 in order to ensure that inadvertent sputtering of the coil material will not contaminate the process. In some instances, intentional sputtering of the internal coil 151 may be used to provide a sputter deposited film on a substrate 158 surface 157.

When it is desired to control the amount of high energy species bombardment on a substrate surface, and there is no target 156 material deposition, this may be accomplished using a plasma of an inert gas generated by the internal RF coil 151. In some instances, this source of high energy species bombardment may be used in combination with sputter deposition of material from target 156, which may also contribute to high energy species striking the substrate surface.

To attract high energy species generated from a plasma adjacent sputtering target 156 toward target 156, the target is negatively biased by a variable DC target power source 190. The target power source 190 negatively biases the target 156 to a negative potential with respect to the chamber shield 166, while igniting and maintaining a plasma in the area of target 156. In addition, the target power source 190 may be maintained at a high level if, in addition to sputtering of target 156, it is desired to increase high energy species bombardment of the substrate 158. In instances when no target is being sputtered, the target source power 190 may be turned off entirely.

The pedestal 162, and hence the substrate 158, may be left electrically floating, but a negative DC self-bias may nonetheless develop on it. Typically, this "self induced" bias is weak, ranging from about −12V to about −30V. Alternatively, the pedestal 162 may be negatively biased by a power source 192, to negatively bias the substrate 158, to better attract the high energy sputter deposition material toward the substrate, and/or to assist in control of the energy level during high energy species bombardment of substrate 158. When an RF bias is applied to the pedestal 162 to further increase the negative bias of the substrate, the substrate bias typically ranges from about −4 0 V to about −300 V.

Typically, one end of the coil 151 is insulatively coupled through the shield 166 by a feedthrough standoff 182 to an RF source, such as the output of an amplifier and matching network 104. The input of the matching network 104, which includes two tuning capacitors 110 and 112, is coupled to an RF generator 106, which provides RF power for inductively coupled plasma (ICP) generation. The RF power to the coil may be turned off during sputter deposition, if desired.

In some instances, one end of the coil 151 is insulatively coupled through the shield 166 by a similar feedthrough standoff 182 to the ground 107, preferably through a blocking capacitor 108, which may be a variable capacitor, to provide a DC bias on the coil 151. The coil 151 is DC biased when it is desired to sputter material from the coil 151 onto the substrate 158. The DC bias on the coil 151 may be controlled through a DC power source 109 coupled to the coil 151.

Depending on the application, the position of the RF coil 151 may be adjusted in the process chamber 152, so that when material is sputtered from the coil 151, the sputtered material has a desired angle of incidence when striking a substrate 158.

III. The Ultra-Low Resistivity Tantalum Films

The tantalum films of the invention have a resistivity of less than 25 μΩ-cm; more preferably, less than 20 μΩ-cm; most preferably, less than 15 μΩ-cm. Resistivities as low as 10 μΩ-cm or less have been achieved using the deposition methods of the invention.

We have discovered a method of producing a $Ta_N$ seed layer which could be used to enable the formation of alpha tantalum. The $Ta_N$ seed layer is generally a tantalum layer with nitrogen atoms in solution within the tantalum. The composition of the $Ta_N$ seed layer is such that nitrogen makes up from about 5 atomic % to about 33 atomic % of the $Ta_N$ film. Typically, nitrogen makes up less than about 25 atomic % of the $Ta_N$ seed layer. Typically, a $Ta_N$ seed layer thickness ranges from about 2 Å to about 100 Å, more typically about 20 Å to about 100 Å. Tantalum deposited over a $Ta_N$ seed layer is alpha tantalum.

We have also discovered a method of depositing an alpha-tantalum liner/barrier layer within a contact via defined in a dielectric layer by producing a $Ta_N$ seed layer over an underlying base layer, where the $Ta_N$ seed layer induces the formation of alpha-tantalum. One embodiment of the invention, alone or in combination with an underlying $Ta_N$ seed layer and/or TaN layer, involves a method of forming a copper-filled conductive interconnect in a via where alpha tantalum provides a barrier layer to diffusion of the copper fill into the underlying dielectric material.

The ultra-low resistivity tantalum films of the invention are particularly suited for use as barrier/adhesion layers for use in copper metallization, in high stability conductive films for integrated circuit devices (e.g., gate material to DRAMs, etc.), in thin film resistors, and in ink jet heads, by way of example and not by way of limitation.

IV. Methods for Depositing the Ultra-Low Resistivity Tantalum Films

One embodiment method which is carried out in a process chamber of the kind shown in FIG. 1, which provides for reactive ion deposition sputtering, comprises sputter depositing a tantalum film on a substrate at a substrate temperature of about 325° C. or greater; preferably, the substrate temperature is within the range of about 350° C. to about 450° C.

In a second embodiment method, which is carried out in a process chamber of the kind shown in FIG. 1, in addition to sputter depositing a tantalum film on a substrate at an elevated temperature, the surface of the film is ion bombarded during deposition, to transfer momentum energy to the film surface. This permits deposition of the film at a temperature which is about 40% lower than when high energy species bombardment is not used.

In a third embodiment, which is an alternative to the second embodiment method, where the process chamber may be a standard sputtering chamber or a processing chamber of the kind shown in FIG. 1, the tantalum film is sputter deposited at room temperature (about 25° C.), and the film is subsequently annealed at a temperature ranging from about 325° C. to about 550° C. for a time period of about 1 minute to about 15 minutes (longer annealing periods will also work).

In a fourth alternative method, which is carried out in a process chamber of the kind shown in FIG. 1, a $Ta_xN_y$ film is sputter deposited on a substrate at an elevated temperature, where x is 1 and y ranges from about 0.05 to about 0.18 (nitrogen is present in the sputtering chamber in an amount which produces a $Ta_xN_y$ film containing between about 5 and about 15 atomic percent nitrogen). The elevated substrate temperature is about 275° C. or greater; preferably, the substrate temperature is within the range of about 300° C. to about 400° C. It is expected that ion bombardment of the $Ta_xN_y$ film surface during sputter deposition would permit deposition of the film at a temperature which is about 40% lower, as described with respect to tantalum.

In a fifth embodiment, which is an alternative to the fourth embodiment method, where the process chamber may be a standard sputtering chamber or a processing chamber of the kind shown in FIG. 1, a $Ta_xN_y$ film is sputter deposited on the substrate at approximately room temperature (i.e., at a substrate temperature within the range of about 15° C. to about 50° C.), and then annealed by heating the film (and substrate) to a temperature within the range of about 325° C. to about 550° C. for aperiod of about 1 minute to about 15 minutes (longer time periods will work also).

The embodiments of the invention described above are not limited to a particular sputtering technique. In addition to the sputtering techniques described above, it is possible to use an externally-generated plasma (typically generated by microwave) which is supplied to the film deposition chamber, or to use a hallow cathode technique of the kind known in the art. However, we have found that when the feature size is small (less than about 0.5 μm) and the aspect ratio is high (about 2:1 or higher), it is advantageous to use collimated, long-throw, or high density plasma sputter deposition (ion plasma deposition) in the apparatus which is described in detail herein.

Typical process parameters for high density plasma sputter deposition, collimated sputter deposition, and long-throw sputter deposition of the ultra-low resistivity tantalum films are set forth in Table 1, below.

TABLE 1

Typical Process Conditions for Sputter Deposition of Ultra-low Resistivity Tantalum Films in an ENDURA ® Process Chamber

| Process Parameter | High Density Plasma | Colli-mated | Long-Throw (Gamma) |
|---|---|---|---|
| Process Chamber Pressure (mT) | 10-40 | 3-5 | 1-3 |
| DC Power to Target (kW) | 1 | 4 | 4 |
| RF Power to Coil (kW) | 1.5 | None | None |
| Bias Power (W) | 350 | None | None |

An example of a high density plasma sputtering method is provided by S. M. Rossnagel and J. Hopwood in their papers "Metal ion deposition from ionized magnetron sputtering discharge", *J. Vac. Sci. Technol. B*, Vol. 12, No. 1 (January/February 1994) and "Thin, high atomic weight refractory film deposition for diffusion barrier, adhesion layer, and seed layer applications", *J. Vac. Sci. Technol. B*, Vol. 14, No. 3 (May/June 1996).

The methods described above are practiced in view of the present disclosure, and do not require alteration of existing physical vapor deposition (PVD) equipment presently available within the industry. However, when it is desired to lower the substrate temperature below about 325° C. during deposition of the tantalum film, it is necessary to use high density plasma sputtering techniques which provide for ion bombardment of the film surface, to add momentum energy to the depositing film surface. This enables lowering of the substrate surface temperature by as much as about 40%, while providing a reasonable film deposition time period.

The methods described above produce tantalum films and $Ta_xN_y$ films having ultra-low bulk resistivities and reduced residual film stress. The methods also provide tantalum films which can be more rapidly polished using CMP techniques. The CMP rate of the low-resistivity tantalum films is more compatible with the CMP rate of copper, resulting in a reduction of copper dishing.

More recently, we have developed a method of depositing alpha tantalum (α tantalum) at temperatures below 65° C., typically as low as about 30° C., depending on the thickness of the a tantalum film. In particular, a $Ta_N$ seed layer is prepared over a substrate surface which is at a temperature of less than about 65° C. and typically at a temperature ranging between about 32° C. and 34° C. Tantalum deposited over the $Ta_N$ seed layer is α tantalum. The α tantalum may be deposited at any convenient temperature, but is typically deposited at a substrate temperature ranging between about 30° C. and about 65° C. The substrate temperature during tantalum deposition generally begins at about 32° C. to about 34° C. and then increases during film deposition, depending on the thickness of the α tantalum film being deposited. When the α tantalum film is about 50 Å or less in thickness, the substrate temperature commonly remains below 35° C. When the a tantalum film thickness is above 50 Å in thickness, for example, about 300 Å, the substrate temperature rises to about 60° C., where it becomes stable due to backside cooling of the substrate.

The composition of the $Ta_N$ seed layer is generally tantalum with nitrogen atoms in solution. The concentration of nitrogen atoms ranges from about 5 atomic % to about 33 atomic %. A nitrogen content of less than about 25 atomic % works particularly well.

In one embodiment, a $Ta_N$ seed layer (to enable subsequent deposition of α tantalum) of the kind described above is prepared by deposition of a tantalum nitride film, followed by high energy species bombardment of the tantalum nitride film surface, combined with sputtered tantalum deposition. Typically, high energy species for the bombardment are generated from an inert, noble gas plasma. Reactive nitrogen species, which are released from the tantalum nitride film surface due to the high energy species bombardment, react with or are dissolved in the sputter depositing tantalum, and provide a $Ta_N$ seed layer containing a specific nominal amount of nitrogen.

Figure 2A:
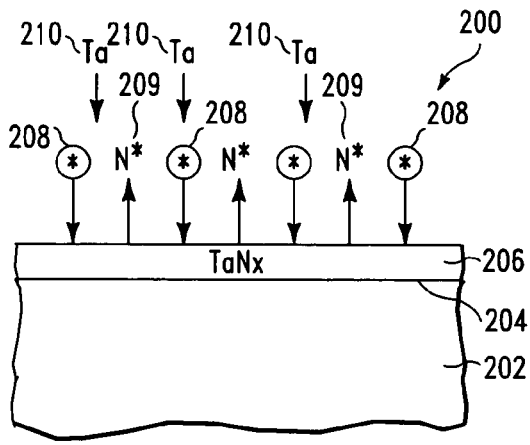
FIG. 2A illustrates an embodiment method of the invention for creating a $Ta_N$ seed layer on a substrate having a TaN film as a base layer on its surface.
Figure 2B:
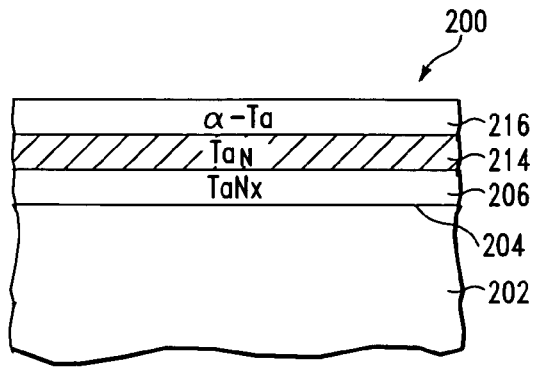
FIG. 2B shows a schematic cross-sectional view of the substrate of FIG. 2A after creation of a $Ta_N$ seed layer and after deposition of alpha-tantalum over the $Ta_N$ seed layer.

FIGS. 2A and 2B illustrate the process described above. FIG. 2A illustrates a schematic cross sectional view of a structure 200 which includes a substrate 202 having an upper surface 204. A conformal layer of tantalum nitride ($TaN_x$) 206, ranging in thickness from about 2 Å to about 100 Å, more typically abut 20 Å to about 100 Å, is deposited over the upper substrate surface 204. The tantalum nitride layer is bombarded with high energy species 208 generated from a plasma. Small amounts of reactive nitrogen species 209 are released from the surface of the tantalum nitride layer 206 due to the high energy species bombardment. By depositing a layer of tantalum 210 over the tantalum nitride layer 206 while it is being bombarded with high energy species 208, a controlled amount of nitrogen is deposited as part of a $Ta_N$ layer that is being deposited. FIG. 2B shows the resulting structure where, deposited over the layer of tantalum nitride (TaN) 206 is a $Ta_N$ seed layer 214 which contains from about 5 atomic % to about 33 atomic % of nitrogen. Typically, the $Ta_N$ seed layer 214 will have about 25 atomic % of nitrogen. The $Ta_N$ seed layer typically ranges from about 2 monolayers to about 10 monolayers, which provides a $Ta_N$ seed layer thickness ranging from about 2 Å to about 100 Å, more typically about 20 Å to about 100 Å. The $Ta_N$ seed layer 214 produced in this manner enables the formation of an α tantalum layer 216 when a sputtered tantalum layer is applied over the seed layer.

Chamber conditions for formation of the $Ta_N$ seed layer will vary depending on the equipment being used. The power to the target, the power to the internal coil, and other process variables which affect plasma density are controlled. In addition, the substrate bias is controlled so that applicants can control the amount of energy in the high energy species bombardment on the tantalum nitride layer surface. Due to the controlled high energy species bombardment, tantalum and nitrogen species are generally not sputtered off the TaN surface onto adjacent surfaces, but merely rise into the space above the TaN surface, where the nitrogen species contact and react with, or are dissolved into, depositing tantalum species. This newly depositing layer, which contains a controlled amount of nitrogen, forms a $Ta_N$ seed layer, which settles down on the TaN layer surface. By controlling the amount of energy in the high energy species bombardment of the tantalum nitride surface, applicants were able to carefully control the concentration of nitrogen in the $Ta_N$ seed layer. This manner of controlling the nitrogen content in a $Ta_N$ seed layer is far more precise than with previously known methods, since more variables can be adjusted to provide a finer control of the nitrogen content. Not only is the amount of nitrogen which enters the plasma controlled, but the amount of tantalum available to react with or dissolve the nitrogen is also carefully controlled.

Process variable conditions also change depending on the wafer size that is being used. For example, in the case of a 200-mm wafer size, process chamber pressure is typically maintained at a range of 0.1 mTorr to about 10 mTorr, with an advantageous range of 1 mTorr to about 5 mTorr. The target is generally negatively biased by a variable DC power source in order to attract ions generated from plasma toward the target. The typical DC power to a tantalum target is in the range of about 0 kW to about 2 kW with an advantageous range of about 0 kW to about 0.8 kW. The typical bias voltage on the target is from about 0 V to about −300 V, with an advantageous range of about 0 V to about −150 V. The pedestal, and hence the substrate, may be left electrically floating, but a negative DC self-bias may nonetheless develop on it. Typically, this "self induced" bias is weak, ranging from about −12 V to about −30 V. Alternately, the pedestal may be negatively biased by a power source in order to keep the substrate at a negative potential, which helps to attract high energy species deposition material to the substrate and to assist in controlling the energy of high energy species during bombardment of the substrate. The substrate is typically maintained at a voltage in the range of about −40V to about −2 50 V, with an advantageous range of about −90 V to about −150 V. The system also includes an internal RF coil which inductively couples RF energy into the interior of the reactor. The RF coil energy is typically used to ionize or reionize sputtered target material from target as the sputtered material passes by the coil. This increases the energy content of sputtered target material at the time of contact with the substrate. In addition, when combined with a bias on the substrate, the RF coil power may be used to increase the bottom coverage of sputter deposited target material on the bottom of a semiconductor substrate feature such as a contact via. The RF coil is typically fabricated from tantalum to prevent process contamination. The RF power to the tantalum coil is in the range of about 0.4 kW to about 3 kW, with an advantageous range of 0.4 kW to about 2 kW. The plasma density of the plasma is in the range of about $8 \times 10^9$ $e^-/cm^3$ to about $1 \times 10^{12}$ $e^-/cm^3$ with an advantageous range of about $8 \times 10^9$ $e^-/cm^3$ to about $9 \times 10^{11}$ $e^-/cm^3$. The plasma may be a high density plasma depending on the wafer size. Summaries of typical process chamber parameters for $Ta_N$ seed layer formation in an ENDURA® ENCORE™ process chamber, for 200-mm wafer size and 300-mm wafer size, are set forth in Table 2, and Table 3, below, respectively.

TABLE 2

Typical Process Conditions for $Ta_N$ Seed Layer Formation for a 200-mm Wafer Size

| Process Parameter | Maximum Range | Typical Range | Advantageous Estimated Range |
|---|---|---|---|
| Process Chamber Pressure (mTorr) | 0.1 to 10 | 0.1 to 5 | 1 to 3 |
| DC Power to Tantalum Target (kW) | 0 to 5 | 0 to 2 | 0 to 0.8 |
| Bias Voltage to Target (V) | 0 to −300 | 0 to −250 | 0 to −150 |
| RF Power to Tantalum Coil (kW) | 0.4 to 3 | 0.4 to 2.5 | 0.4 to 2 |
| RF Power to Bias Substrate (W) | 100 to 800 | 300 to 800 | 300 to 600 |
| Bias Voltage on Substrate Surface (V) | −40 to −250 | −60 to −250 | −90 to −150 |
| Plasma Density ($e^-/cm^3$) | $8 \times 10^9$ to $1 \times 10^{12}$ | $8 \times 10^9$ to $9 \times 10^{11}$ | $8 \times 10^9$ to $9 \times 10^{11}$ |
| Substrate Temperature (° C.) | 30 to 100 | 30 to 70 | 30 to 60 |
| Process Wall Temperature (° C.) | 200 to 300 | 200 to 300 | — |

TABLE 3

Typical Process Conditions for $Ta_N$ Seed Layer Formation for a 300-mm Wafer Size

| Process Parameter | Maximum Range | Typical Range | Optimum Estimated Range |
|---|---|---|---|
| Process Chamber Pressure (mTorr) | 0.5 to 30 | 0.5 to 5 | 0.5 to 3 |
| DC Power to Tantalum Target (kW) | 0 to 5 | 0 to 5 | 0 to 5 |
| Bias Voltage to Target (V) | 0 to −350 | 0 to −300 | 0 to −250 |
| RF Power to Tantalum Coil (kW) | 0.5 to 3.5 | 0.5 to 2 | 0.5 to 2 |
| RF power to bias substrate (W) | 100 to 1600 | 200 to 900 | 200 to 850 |
| Bias Voltage on Substrate Surface (V) | −40 to −250 | −60 to −250 | −80 to −200 |
| Plasma Density ($e^-/cm^3$) | $7 \times 10^9$ to $1 \times 10^{12}$ | $7 \times 10^9$ to $9 \times 10^{11}$ | $7 \times 10^9$ to $9 \times 10^{11}$ |
| Substrate Temperature (° C.) | 30 to 100 | 30 to 70 | 30 to 60 |
| Process Wall Temperature (° C.) | 200 to 300 | 200 to 300 | — |

In another embodiment of the invention for forming a $Ta_N$ seed layer, a layer of tantalum is deposited on a substrate surface. The tantalum layer is bombarded with high energy species from a plasma containing a mixture of an inert or noble gas and nitrogen. The Ta species, which are released from the surface of the tantalum layer due to high energy species bombardment, trap small amounts of nitrogen from the plasma and then redeposit on the surface of the tantalum layer, forming a $Ta_N$ seed layer over the tantalum layer.

Figure 3A:
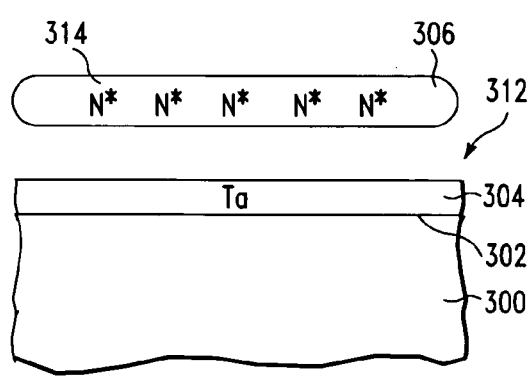
FIG. 3A shows a schematic cross-sectional view of a substrate having a tantalum film on its surface, with a plasma containing nitrogen species present over the tantalum film surface.
Figure 3B:
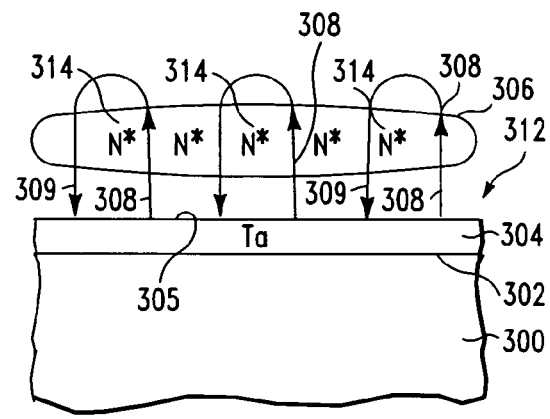
FIG. 3B illustrates an embodiment method of the invention for creating a $Ta_N$ seed layer on a substrate having a Ta base layer on its surface.
Figure 3C:
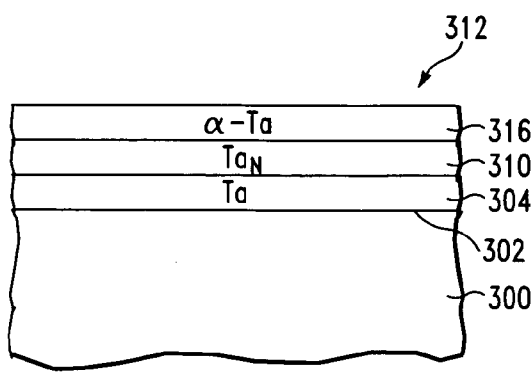
FIG. 3C shows a schematic cross-sectional view of a substrate having a tantalum film on its surface, with a $Ta_N$ seed layer overlying the Ta film, and after deposition of alpha-tantalum over the $Ta_N$ seed layer.

FIGS. 3A-3C illustrate the method embodiment using a tantalum layer as the substrate surface. FIG. 3A shows a schematic cross sectional view of a structure 312 which includes substrate 300 having an upper surface 302. A conformal layer of tantalum 304 having a thickness greater than 5 Å is present on the upper surface 302 of substrate 300. A mixture of a noble gas (argon) with nitrogen was used to generate a plasma 306 which furnishes high energy species for bombardment of the tantalum layer 304. FIG. 3B illustrates the tantalum species 308, which are released due to the bombardment, capturing a small amount of nitrogen species 314 from the nitrogen containing plasma 306 and redepositing, as indicated by arrows 309, on the surface 305 of the tantalum layer 304. FIG. 3C shows the structure 312 after the deposition of $Ta_N$ seed layer 310, and after subsequent deposition of α layer of a tantalum over the $Ta_N$ seed layer. The structure 312 includes a tantalum layer 304 with a $Ta_N$ seed layer 310 formed over the tantalum layer 304. The $Ta_N$ seed layer contains from about 5 atomic % to about 33 atomic % of nitrogen. Typically, the $Ta_N$ seed layer 310 will contain about 25 atomic % of nitrogen. The $Ta_N$ seed layer typically ranges from about 2 monolayers to about 10 monolayers in thickness, which provides a $Ta_N$ seed layer thickness ranging from about 2 Å to about 100 Å, more typically about 20 Å to about 100 Å. The $Ta_N$ seed layer 310 produced in the manner described above enables the formation of a layer of alpha tantalum 316 when a sputtered tantalum layer is applied over the $Ta_N$ seed layer 310.

One skilled in the art will be able to adjust chamber processing conditions, depending on the equipment being used in view of this disclosure. By controlling the plasma density, and the amount of substrate bias, applicants were able to control the energy of the high energy species during bombardment of the tantalum layer. Controlling the plasma density and voltage on the substrate surface, ensures that the amount of energy transferred to the substrate is sufficient to cause the Ta species to rise into the space above the Ta surface where the nitrogen species from the plasma contact and react with or are dissolved into the tantalum species. This forms a $Ta_N$ composition which settles down on the surface 305 of Ta layer 304, forming a $Ta_N$ seed layer 310. By controlling the plasma density and the voltage on the substrate, applicants were able to make certain that the amount of energy that was transferred to the substrate surface, while sufficient to provide the desired nominal amount of Ta species above the Ta film surface, did not cause any significant amount of resputtering of Ta from the Ta film surface onto adjacent non-tantalum containing surfaces. The controlled high energy species bombardment of the tantalum layer surface, combined with control of the amount of nitrogen in the plasma, enabled a precise control of the concentration of nitrogen in the $Ta_N$ seed layer. This manner of controlling the nitrogen content in the seed layer is far more precise than with previously known methods.

Typically, the plasma source gas from which the plasma is generated contains about 10 volumetric % nitrogen to about 75 volumetric % nitrogen, with the remainder of the plasma source gas being an inert gas such as He, Ne, Ar, Xe, or Kr, by way of example and not by way of limitation.

Process chamber conditions also vary depending on the wafer size that is being used. For example, in the case of a 200-mm wafer size, process chamber pressure is typically maintained within a range of 0.1 mTorr to about 30 mTorr, with an advantageous range of 0.1 mTorr to about 5 mTorr. The pedestal, and hence the substrate, may be left electrically floating, but a negative DC self-bias may nonetheless develop on it. Typically, this "self induced" bias is weak, ranging from about −12 V to about −30 V. Alternately, the pedestal may be negatively biased by a power source in order to keep the substrate at a negative potential, which helps to attract the high energy deposition material to the substrate, and to assist in control of the energy imparted during high energy species bombardment of substrate. The substrate is typically maintained at a voltage in the range of about −40 V to about −300 V, with an advantageous range of about −60 V to about −200 V. The system also includes an internal RF coil which inductively couples RF energy into the interior of the reactor. The RF coil energy is typically used to add energy to the high energy species of contact with the substrate. In addition, when combined with a bias on the substrate, the RF coil power may be used to control the high energy species bombardment of the substrate. The RF coil is typically fabricated from tantalum to prevent contamination. The RF power to the tantalum coil is in the range of about 0.4 kW to about 3 kW, with an advantageous range of 0.4 kW to about 2 kW. The plasma density of the plasma is typically in the range of about $8 \times 10^9$ $e^-/cm^3$ to about $1 \times 10^{12}$ $e^-/cm^3$, with an advantageous range of about $4 \times 10^9$ $e^-/cm^3$ to about $1 \times 10^{12}$ $e^-/cm^3$. The plasma may be a high density plasma. Summaries of typical process chamber parameters for $Ta_N$ seed layer formation in an ENDURA® ENCORE™ process chamber, for a 200-mm wafer size and for a 300-mm wafer size are set forth in Table 4 and Table 5, below, respectively.

TABLE 4

Typical Process Conditions for $Ta_N$ Seed Layer Formation for a 200-mm Wafer Size

| Process Parameters | Maximum Range | Typical Range | Optimum Estimated Range |
|---|---|---|---|
| Process Chamber Pressure (mTorr) | 0.1 to 30 | 0.1 to 5 | 0.1 to 5 |
| RF Power to Bias Substrate (kW) | 0.1 to 0.8 | 0.3 to 0.8 | 0.3–0.6 |
| Bias Voltage on Substrate Surface (V) | −40 to −300 | −60 to −250 | −60 to −200 |

TABLE 4-continued

Typical Process Conditions for $Ta_N$ Seed Layer Formation for a 200-mm Wafer Size

| Process Parameters | Maximum Range | Typical Range | Optimum Estimated Range |
|---|---|---|---|
| RF Power to Coil (kW) | 0.4 to 3 | 0.4 to 2.5 | 0.4 to 2 |
| Plasma Density ($e^-/cm^3$) | $8 \times 10^9$ to $1 \times 10^{12}$ | $4 \times 10^9$ to $6 \times 10^{11}$ | $4 \times 10^9$–$1 \times 10^{11}$ |
| Substrate Temperature (° C.) | 30 to 100 | 30 to 70 | 30 to 60 |
| Process Wall Temperature (° C.) | 200 to 300 | 200 to 300 | — |

TABLE 5

Typical Process Conditions for $Ta_N$ Seed Layer Formation for a 300-mm Wafer Size

| Process Parameters | Maximum Range | Typical Range | Optimum Estimated Range |
|---|---|---|---|
| Process Chamber Pressure (mTorr) | 1 to 30 | 0.5 to 5 | 0.5 to 5 |
| RF Power to Bias Substrate (kW) | 0.1 to 1.2 | 0.2 to 1 | 0.2 to 0.85 |
| Bias Voltage on Substrate Surface (V) | −60 to −350 | −60 to −300 | −60 to −200 |
| RF Power to Coil (kW) | 0.5 to 3 | 0.5 to 2.5 | 0.5 to 2 |
| Plasma Density ($e^-/cm^3$) | $1 \times 10^{10}$ to $1 \times 10^{12}$ | $1 \times 10^{10}$ to $6 \times 10^{11}$ | $1 \times 10^{10}$ to $6 \times 10^{11}$ |
| Substrate Temperature (° C.) | 30 to 100 | 30 to 70 | 30 to 60 |
| Process Wall Temperature (° C.) | 200 to 300 | 200 to 300 | — |

After formation of at least two monolayers of a $Ta_N$ seed layer, by either of the two methods described above, tantalum that is subsequently deposited over the $Ta_N$ seed layer is alpha-tantalum.

Further, the $Ta_N$ layer itself exhibits ultra low resistivity, in the range of 30 μΩcm or less, and may be used as a low resistivity barrier layer by itself, as an alternative to an α tantalum barrier layer.

Typical chamber process parameters for subsequently depositing Ta vary depending on the processing equipment being used. For example, in an ENDURA® ENCORE™ process chamber, the process chamber pressure is typically maintained at a range of 1 mTorr to about 3 mTorr with a typical pressure of about 2.5 mTorr. The tantalum target is typically negatively biased by using a variable DC power source, in order to attract high energy species generated from plasma toward the target. The DC power to the tantalum target is typically in the range of about 20 kW to about 40 kW, with a more typical range of about 20 kW to about 35 kW. A summary of typical process chamber parameters for Ta sputter deposition in an ENDURA® ENCORE• process chamber is set forth in Table 6, below.

TABLE 6

Typical Process Conditions for Ta Sputter Deposition

| Process Parameters | Maximum Range | Typical Range |
|---|---|---|
| Process Chamber Pressure (mTorr) | 1 to 3 | 2.5 |
| DC Power to Target (kW) | 20 to 40 | 20 to 35 |
| RF Power to Coil | 0 | 0 |
| Bias Power (W) | 0 to 800 | 0 to 300 |
| Substrate Temperature (° C.) | 30 to 70 | 30 to 60 |
| Process Wall Temperature (° C.) | 200 to 300 | 200 to 300 |

Figure 4A:
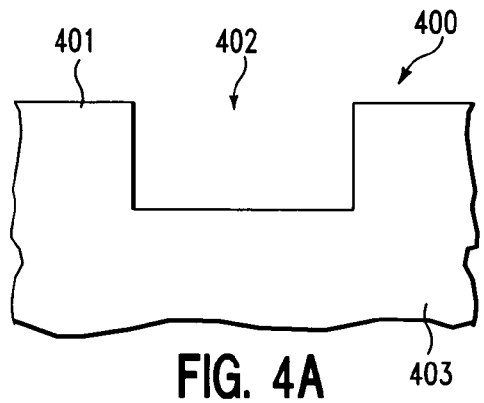
FIGS. 4A-4E illustrate the steps involved in a method of depositing an alpha-tantalum liner/barrier layer within a via defined in a dielectric layer.
Figure 4B:
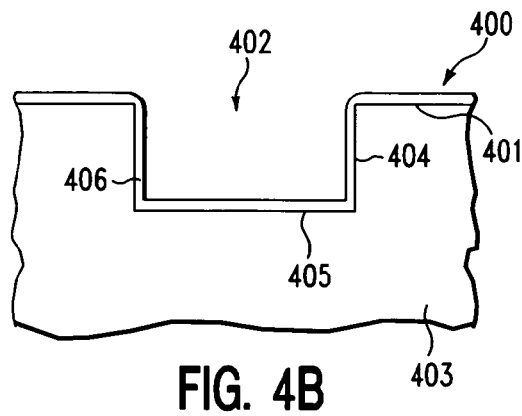
Figure 4C:
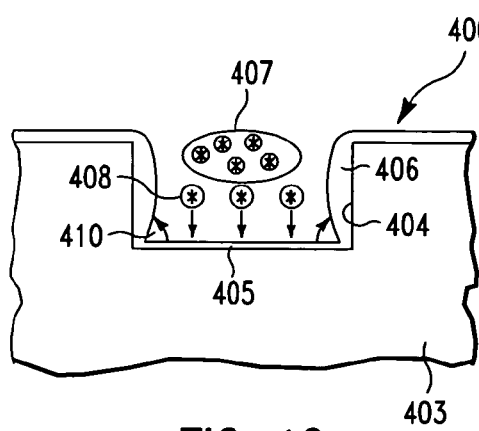

Another embodiment of the invention involves forming an alpha-tantalum/TaN liner/barrier layer within a contact via defined in a dielectric layer. In one embodiment of this method, a conformal layer of TaN having a thickness in the range of about 10 Å to about 100 Å is deposited on the surfaces of the via in the dielectric layer. If the initial deposited tantalum nitride conformal layer is thicker than desired, resputtering of the initial tantalum nitride conformal layer may be performed in order to reduce the thickness of the initially deposited layer at the bottom of the contact via. An example of such a method is shown in FIGS. 4A-4E. FIG. 4A shows a structure 400 having a via 402 formed within a dielectric layer 403. A layer of TaN 406 is conformally deposited over the upper surface 401 of the structure 400, including the side wall 404 and the bottom 405 of the via 402, as shown in FIG. 4B. When the layer as initially deposited is not conformal, in order to thin the thickness of the TaN layer 406 at the bottom 405 of the via, the TaN layer may be resputtered using high energy species 408, from a plasma 407, as illustrated in FIG. 4C. The contents from the TaN layer 406, are resputtered from the bottom 405 of the via 402 onto the sidewall 404 of the via, as indicated by arrow 410, thus thinning the TaN layer 406 at the bottom of the via and increasing the thickness of the TaN layer on the side wall 404 of the via.

Figure 4D:
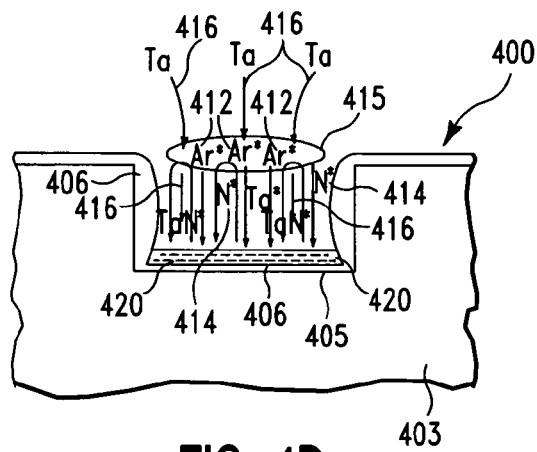
Figure 4E:
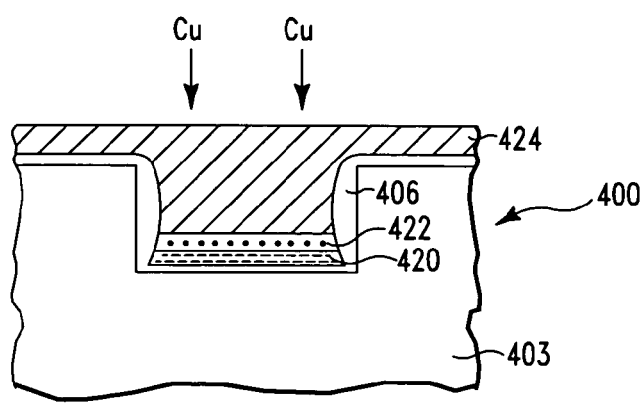

Subsequently, the method of the invention described above with respect to a TaN underlying layer is used to produce a $Ta_N$ seed layer on the bottom of the contact via. FIG. 4D illustrates the process of forming a $Ta_N$ seed layer. In FIG. 4D, the thin TaN layer 406 at the bottom 405 of the contact via is bombarded with high energy argon species 412 from a plasma 415, releasing nitrogen species 414 from the TaN layer 405. Tantalum 416 is being simultaneously deposited, while the TaN layer 406 at the bottom 405 of the via 402 is bombarded with high energy species 412. The released nitrogen species 414 react with the tantalum 416 that is being deposited, forming a thin $Ta_N$ seed layer 420 of tantalum containing a minor amount of nitrogen. The $Ta_N$ seed layer 420 contains from about 5 atomic % to about 33 atomic % of nitrogen. The $Ta_N$ seed layer 420 typically ranges from about 2 monolayers to about 10 monolayers in thickness, which provides a $Ta_N$ seed layer 420 thickness ranging from about 2 Å to about 100 Å, more typically about 20 Å to about 100 Å. As shown in FIG. 4E, an alpha-tantalum layer 422 having a thickness of 5 Å or greater is deposited on $Ta_N$ seed layer 420. FIG. 4E further shows a layer of copper 424 deposited over the alpha tantalum layer 422, filling the via 402. The diffusion of copper 424 into dielectric layer 403 is prevented by the liner/barrier layer formed by the alpha-tantalum layer 422 and underlying $Ta_N$ seed layer 420 and residual TaN layer at the bottom, and the tantalum nitride layer 406 on the side walls 404 of contact via 402.

Process chamber conditions for depositing a $Ta_N$ layer in a contact via (which may have an aspect ratio of 3:1 or greater) vary depending on the wafer size that is being used. For example, in the case of a 200-mm wafer size, process chamber pressure is typically maintained within a range of 0.1 mTorr to about 3 mTorr, with an advantageous range of 0.1 mTorr to about 2 mTorr. With reference to FIG. 1, a tantalum target 156 is generally negatively biased by a variable DC power source 190 in order to attract ions generated from a plasma toward the target 156. The typical DC power to a tantalum target for an ENDURA® ENCORE™ sputtering chamber is in the range of about 0 kW to about 0.8 kW. The typical bias voltage on the target is from about 0 V to about −250 V, with an advantageous range of about 0 V to about −150 V. The pedestal 162, and hence the substrate 158, may be left electrically floating, but a negative DC self-bias may nonetheless develop on it. Typically, this "self induced" bias is weak, ranging from about −10 V to about −20 V. Alternatively, the pedestal 162 may be negatively biased by a power source 192 in order to keep the substrate 158 at a negative potential, which helps to attract the ionized deposition material to the substrate 158, and/or to assist in control of the ion energy during high energy species bombardment of substrate 158. The substrate 158 is maintained at a voltage in the range of about −40 V to about −250 V with an advantageous range of about −60 V to about −200 V. The ENCORE™ system 100 also includes an internal RF coil 151 which inductively couples RF energy into the interior of the process chamber 152. The RF coil energy is typically used to ionize or reionize sputtered target material from target 156 as the sputtered material passes by the coil 151. This increases the energy content of sputtered target material at the time of contact with the substrate. In addition, when combined with a bias on the substrate, the RF coil power may be used to increase the bottom coverage of sputter deposited target material on the bottom of a semiconductor substrate feature such as a contact via. The RF coil is typically fabricated from tantalum to prevent process contamination. The RF power to the tantalum coil 151 is in the range of about 0.4 kW to about 2.5 kW with an advantageous range of 0.4 kW to about 2 kW. The plasma density of the plasma is in the range of about $8 \times 10^9$ e⁻/cm³ to about $1 \times 10^{12}$ e⁻/cm³, with an advantageous range of about $8 \times 10^9$ e⁻/cm³ to about $5 \times 10^{-}$e⁻/cm³. The plasma may be a high density plasma or may be a moderate density plasma. Summaries of typical process chamber parameters for $Ta_N$ layer formation in an ENDURA® ENCORE™ process chamber, for a 200-mm wafer size and for a 300-mm wafer size are set forth in Table 7 and Table 8, below, respectively.

TABLE 7

Typical Process Conditions for $Ta_N$ Seed Layer Formation for a 200-mm Wafer Size

| Process Parameter | Maximum Range | Typical Range | Advantageous Estimated Range |
|---|---|---|---|
| Process Chamber Pressure (mTorr) | 0.1 to 10 | 0.1 to 3 | 0.1 to 2 |
| DC Power to Tantalum Target (kW) | 0 to 1 | 0 to 0.8 | 0 to 0.8 |

TABLE 7-continued

Typical Process Conditions for Ta$_N$ Seed Layer Formation for a 200-mm Wafer Size

| Process Parameter | Maximum Range | Typical Range | Advantageous Estimated Range |
|---|---|---|---|
| Bias Voltage to Target (V) | 0 to −250 | 0 to −250 | 0 to −150 |
| RF Power to Tantalum Coil (kW) | 0.4 to 3 | 0.4 to 2 | 0.4 to 2 |
| RF Power to Bias Substrate (W) | 300 to 800 | 300 to 800 | 300 to 600 |
| Bias Voltage on Substrate Surface (V) | −40 to −250 | −60 to −250 | −60 to −200 |
| Plasma Density (e$^-$/cm$^3$) | $8 \times 10^9$ to $1 \times 10^{12}$ | $8 \times 10^9$ to $5 \times 10^{11}$ | $8 \times 10^9$ to $5 \times 10^{11}$ |
| Substrate Temperature (° C.) | 30 to 100 | 30 to 70 | 30 to 60 |
| Process Wall Temperature (° C.) | 200 to 300 | 200 to 300 | — |

TABLE 8

Typical Process Conditions for Ta$_N$ Seed Layer Formation for a 300-mm Wafer Size

| Process Parameter | Maximum Range | Typical Range | Optimum Estimated Range |
|---|---|---|---|
| Process Chamber Pressure (mTorr) | 1 to 30 | 0.5 to 5 | 0.5 to 3 |
| DC Power to Tantalum Target (kW) | 0 to 5 | 0 to 5 | 0 to 5 |
| Bias Voltage to Target (V) | 0 to −350 | 0 to −300 | 0 to −250 |
| RF Power to Tantalum Coil (kW) | 0 to 3.5 | 0.5 to 2 | 0.5 to 2 |
| RF Power to Bias Substrate (W) | 200 to 1600 | 200 to 900 | 200 to 800 |
| Bias Voltage on Substrate Surface (V) | −40 to −250 | −80 to −250 | −80 to −200 |
| Plasma Density (e$^-$/cm$^3$) | $7 \times 10^9$ to $1 \times 10^{12}$ | $7 \times 10^9$ to $5 \times 10^{11}$ | $7 \times 10^9$ to $5 \times 10^{11}$ |
| Substrate Temperature (° C.) | 30 to 100 | 30 to 70 | 30 to 60 |
| Process Wall Temperature (° C.) | 200 to 300 | 200 to 300 | — |

Figure 5A:
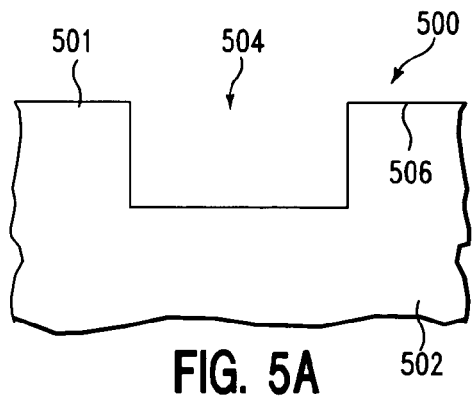
FIGS. 5A-5G illustrate the steps involved in a second method of forming a Cu interconnect in a via defined in a dielectric layer.
Figure 5B:
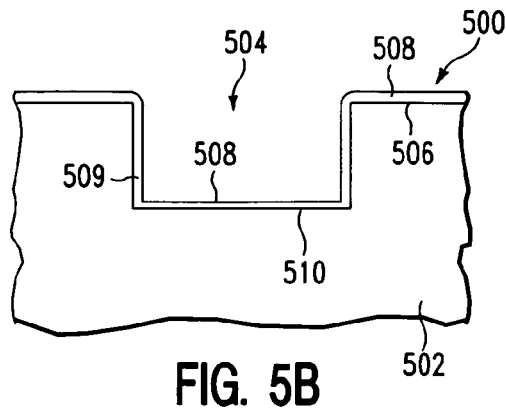
Figure 5C:
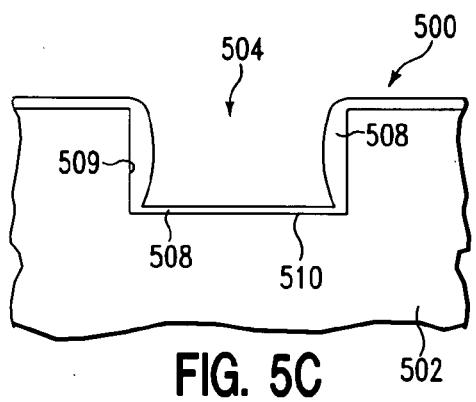
Figure 5D:
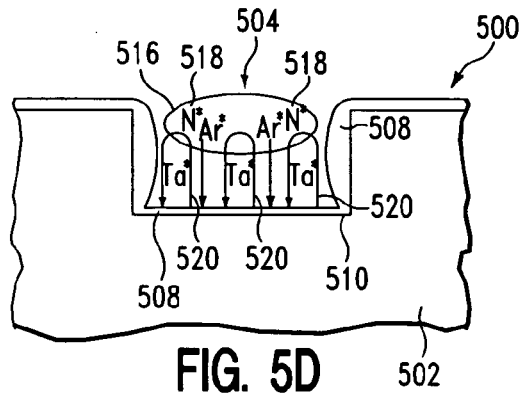
Figure 5E:
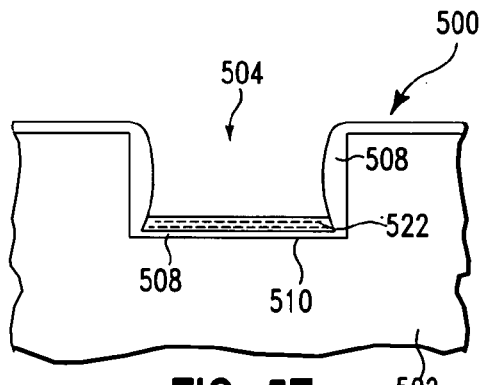
Figure 5F:
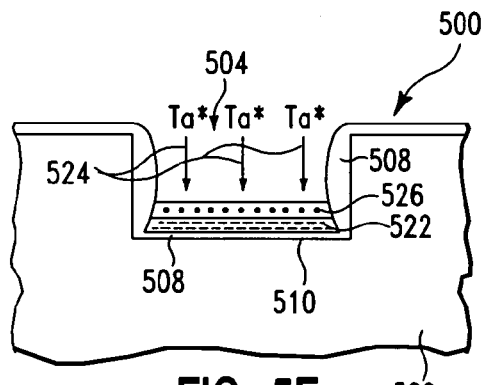
Figure 5G:
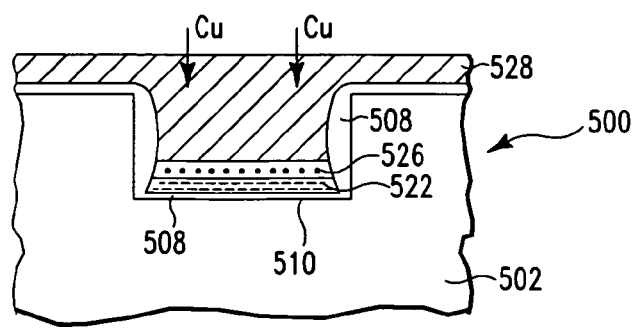

Another embodiment of the invention teaches a method of forming a copper interconnect in a via defined in a dielectric layer, where an initially deposited conformal layer is Ta rather than TaN. FIGS. 5A-5G show sequential cross-sectional views of the formation of a copper interconnect structure, including an alpha-tantalum barrier layer, which is deposited over a Ta$_N$ layer. FIG. 5A shows a cross sectional view of structure 500, which includes a dielectric layer 502 having a via 504 etched into dielectric layer 502. The drawings are not to scale, as the aspect ratios of such contact vias are commonly 3:1 or greater. FIG. 5B shows a layer of tantalum 508 is conformally deposited over the upper surface 506 of the structure 500, including the side walls 509 and bottom 510 of the via 504. If the initially deposited layer of tantalum 509 is not conformal at the bottom 510 of the via and is thicker than desired, then the bottom 510 area of the via 502 may be resputtered to redistribute the tantalum. FIG. 5C illustrates the structure after a resputtering process, which transfers tantalum from the bottom 510 of tantalum layer 508 to the sidewalls 509 of tantalum layer 508, as described previously with reference to FIGS. 4B and 4C. A Ta$_N$ layer 522 is then produced upon the upper surface 513 of tantalum layer 508 using the method described previously herein. The thinned Ta layer 508 is used to produce a Ta$_N$ layer 522 on the bottom surface 513 of Ta layer 508. FIGS. 5D and 5E illustrate the Ta$_N$ layer formation process. In FIG. 5D, the thin tantalum layer 508 remaining at the bottom 510 of via 504 is bombarded with high energy species from a plasma 516 containing nitrogen species 518. The displaced tantalum species 520, due to the momentum transfer during the high energy species bombardment, trap some of the nitrogen species 518 in the tantalum redepositing from the tantalum species 520 as they fall back onto the tantalum layer 508 at the base 510 of the via 504. FIG. 5E shows a Ta$_N$ layer 522 which contains a small amount of nitrogen, formed at the bottom 510 of the via 504. The Ta$_N$ layer 522 typically ranges from about 2 monolayers to about 10 monolayers in thickness, which provides a Ta$_N$ layer 522 thickness ranging from about 2 Å to about 100 Å, more typically about 20 Å to about 200 Å. After the formation of Ta$_N$ layer 522, any tantalum subsequently deposited over the Ta$_N$ layer 522 is alpha-tantalum. FIG. 5F shows tantalum species 524 depositing over Ta$_N$ layer 522 to form alpha tantalum layer 526. In order to form a conductive feature within the dielectric layer 502, a layer of copper 528 may be deposited over the alpha-tantalum layer 526, filling the via 504 as shown in FIG. 5G. The tantalum layer, 508, the alpha tantalum layer 526, and the Ta$_N$ layer 522 prevent the copper layer from diffusing into the dielectric layer 502.

Process chamber conditions for forming a Ta$_N$ layer upon a conformal Ta layer surface vary depending on the wafer size that is being used. For example, with reference to an ENCORE™ process chamber, in the case of a 200-mm wafer size, process chamber pressure is typically maintained at a range of 0.1 mTorr to about 3 mTorr, with an advantageous range of 0.1 mTorr to about 2 mTorr. With reference to FIG. 1, the pedestal 162, and hence the substrate 158, may be left electrically floating, but a negative DC self-bias may nonetheless develop on it. Typically, this "self induced" bias is weak, ranging from about −10 V to about −20 V. Alternatively, the pedestal 168 may be negatively biased by a power source in order to keep the substrate 158 at a negative potential, which helps to attract the ionized deposition material to the substrate. This power application my be used to assist in control of the high energy species density and in the overall energy of the high energy species bombarding the substrate 158. The substrate 158 is typically maintained at a voltage in the range of about −60 V to about −300 V, with an advantageous range of about −60 V to about −200 V. The ENCORE™ system also includes an internal RF coil 151 which inductively couples RF energy into the interior of the process chamber 152. The RF coil 151 energy is typically used to add energy to the high energy species in the plasma as the species pass by the coil. This increases the energy content in the plasma, and combined with a bias on the substrate, may be used to control the amount of energy present in the high energy species bombarding the substrate 158. The RF power 112 to the tantalum coil 151 is in the range of about 0.4 kW to about 3 kW, with an advantageous range of 0.4 kW to about 3 kW. The plasma density of the plasma is in the range of about $8 \times 10^9$ e$^-$/cm$^3$ to about $1 \times 10^{11}$ e$^-$/cm$^3$, with an advantageous range of about $4 \times 10^9$ e$^-$/cm$^3$ to about $4 \times 10^9$ e$^-$/cm$^3$. The plasma may be a high density plasma or may be a moderate density plasma as can be seen from these numbers. Summaries of typical process chamber parameters for $Ta_N$ seed layer formation in an ENDURA® ENCORE™ process chamber, for a 200-mm wafer size and for a 300-mm wafer size are set forth in Table 9 and Table 10, below, respectively.

TABLE 9

Typical Process Conditions for $Ta_N$ Seed Layer Formation for a 200-mm Wafer Size

| Process Parameters | Maximum Range | Typical Range | Advantageous Estimated Range |
|---|---|---|---|
| Process Chamber Pressure (mTorr) | 0.1 to 30 | 0.1 to 3 | 0.1 to 2 |
| RF Power to Bias Substrate (kW) | 300 to 800 | 300 to 800 | 300 to 600 |
| Bias Voltage on Substrate Surface (V) | −60 to −300 | −60 to −250 | −60 to −200 |
| RF Power to Coil (kW) | 0.4 to 3 | 0.4 to 2 | 0.4 to 2 |
| Plasma Density ($e^-/cm^3$) | $4 \times 10^9$ to $1 \times 10^{12}$ | $8 \times 10^9$ to $5 \times 10^{11}$ | $8 \times 10^9$ to $1 \times 10^{11}$ |
| Substrate Temperature (° C.) | 30 to 100 | 30 to 70 | 30 to 60 |
| Process Wall Temperature (° C.) | 200 to 300 | 200 to 300 | — |

TABLE 10

Typical Process Conditions for a $Ta_N$ Seed Layer Formation for a 300-mm Wafer Size

| Process Parameters | Maximum Range | Typical Range | Advantageous Estimated Range |
|---|---|---|---|
| Process Chamber Pressure (mTorr) | 1 to 30 | 0.5 to 5 | 0.5 to 3 |
| RF Power to Bias Substrate (kW) | 0.1 to 1.2 | 0.2 to 0.9 | 0.2 to 0.8 |
| Bias Voltage on Substrate Surface (V) | −60 to −350 | −60 to −300 | −60 to −200 |
| RF Power to Coil (kW) | 0.5 to 3 | 0.5 to 2 | 0.5 to 2 |
| Plasma Density ($e^-/cm^3$) | $1 \times 10^{10}$ to $5 \times 10^{11}$ | $1 \times 10^{10}$ to $5 \times 10^{11}$ | $1 \times 10^{10}$ to $1 \times 10^{11}$ |
| Substrate Temperature (° C.) | 30 to 100 | 30 to 70 | 30 to 60 |
| Process Wall Temperature (° C.) | 200 to 300 | 200 to 300 | — |

Although process conditions provided in the embodiment examples described herein are for an ENCORE™ processing chamber, it is not necessary that this apparatus design be used to carry out the method used to form a $Ta_N$ layer. As can be seen from the lower portion of the plasma density ranges provided for $Ta_N$ layer formation, a moderate plasma having a density as low as about $4 \times 10^9$ $e^-/cm^3$ may be used. One skilled in the art will appreciate that an internal energy input coil is not required to produce such a moderate density plasma. In fact, the plasma may be produced using non-inductively coupled apparatus, and even a remotely generated plasma (generated outside of the processing chamber) may be used.

The advantage of using an ENCORE™ processing chamber and auxiliary elements is that this processing system provides a number of elements which may be used to control both plasma density and the impacting momentum of high energy species bombarding a substrate. This permits excellent control over the $Ta_N$ layer crystalline structure and the nitrogen content of the seed layer. Such control prevents the bombarding high energy species from striking the substrate surface with too much momentum, harming the seed layer structure.

In addition to providing control over the $Ta_N$ layer structure and nitrogen content, the ENCORE™ processing system enables both high density and moderate density plasmas to be used in combination with varying amounts of substrate biasing and sputtering target biasing. This makes possible Ta and $Ta_N$ sputter deposition, resputtering of deposited layers, and $Ta_N$ layer formation in the same process chamber. Sputtered copper seed layer deposition and copper fill (trench and via) layer deposition may also be carried out in an ENCORE™ processing system, typically using a separate processing chamber than that used for the Ta and $Ta_N$ deposition, for reasons of contamination.

The above described preferred embodiments are not intended to limit the scope of the present invention, as one skilled in the art can, in view of the present disclosure expand such embodiments to correspond with the subject matter of the invention as claimed below.

We claim:

1. A method of depositing a tantalum nitride/alpha-tantalum-comprising barrier layer over a semiconductor substrate surface, comprising the steps of:
    (a) depositing a layer of tantalum nitride over a semiconductor substrate surface using chemical vapor deposition;
    (b) producing a $Ta_N$ seed layer over said tantalum nitride layer, wherein said $Ta_N$ seed layer is capable of inducing the formation of alpha-tantalum when tantalum is deposited over said $Ta_N$ seed layer, wherein said $Ta_N$ seed layer is produced by:
        controlling an energy level of high energy species bombarding a tantalum nitride film surface; and
        controlling an amount of tantalum sputter deposited over said tantalum nitride surface during said bombardment of said tantalum nitride film surface by said high energy species, so that a seed layer of $Ta_N$ is formed which contains between about 5 atomic % and about 33 atomic % nitrogen.

2. A method in accordance with claim 1, wherein said method further comprises continued deposition of tantalum over said $Ta_N$ seed layer to provide a tantalum nitride/$Ta_N$/alpha-tantalum barrier layer.

3. A method in accordance with claim 1, wherein said $Ta_N$ seed layer has a thickness within the range of about 2 Å to about 100 Å.

4. A method in accordance with claim 3, wherein said $Ta_N$ seed layer has a thickness within the range of about 20 Å to about 100 Å.

5. A method in accordance with claim 1, wherein said alpha-tantalum layer has a thickness of about 60 Å or less.

6. A method in accordance with claim 5, wherein said alpha-tantalum layer has a thickness of greater than about 5 Å.

7. A method in accordance with claim 1, wherein said alpha-tantalum layer is deposited using standard sputtering techniques.

8. A method in accordance with claim 1, wherein said alpha-tantalum layer is deposited using reactive ion deposition sputtering techniques.

9. A method in accordance with claim 1, wherein said tantalum nitride layer has a thickness within the range of about 10 Å to about 300 Å.

10. A method in accordance with claim 1, of producing a semiconductor structure comprising a barrier layer underlying a copper seed layer, including an additional step:
(c) depositing a sputtered seed layer of copper over a surface of said barrier layer, wherein steps (a) and (b) are carried out in a first chamber of a multi-chamber processing system, and step (c) is carried out in a second chamber of said multi-chamber processing system.

11. A method in accordance with claim 10, of producing a semiconductor structure comprising a barrier layer underlying a copper seed layer, including an additional step:
(c) depositing a sputtered seed layer of copper over a surface of said barrier layer, wherein steps (a) and (b) are carried out in a first chamber of a multi-chamber processing system, and step (c) is carried out in a second chamber of said multi-chamber processing system.

12. A method of depositing a tantalum nitride/alpha-tantalum-comprising barrier layer over a semiconductor substrate surface, comprising the steps of:
(a) depositing a layer of tantalum nitride over a semiconductor substrate surface using standard sputtering techniques;
(b) producing a $Ta_N$ seed layer over said tantalum nitride layer, wherein said $Ta_N$ seed layer is capable of inducing the formation of alpha-tantalum when tantalum is deposited over said $Ta_N$ seed layer, wherein said $Ta_N$ seed layer is produced by:
controlling an energy level of high energy species bombarding a tantalum nitride film surface; and
controlling an amount of tantalum sputter deposited over said tantalum nitride surface during said bombardment of said tantalum nitride film surface by said high energy species, so that a seed layer of $Ta_N$ is formed which contains between about 5 atomic % and about 33 atomic % nitrogen.

13. A method in accordance with claim 12, wherein said method further comprises continued deposition of tantalum over said $Ta_N$ seed layer to provide a tantalum nitride/$Ta_N$/alpha-tantalum barrier layer.

14. A method in accordance with claim 12, wherein said $Ta_N$ seed layer has a thickness within the range of about 2 Å to about 100 Å.

15. A method in accordance with claim 14, wherein said $Ta_N$ seed layer has a thickness within the range of about 20 Å to about 100 Å.

16. A method in accordance with claim 12, wherein said alpha-tantalum layer has a thickness of about 60 Å or less.

17. A method in accordance with claim 16, wherein said alpha-tantalum layer has a thickness of greater than about 5 Å.

18. A method in accordance with claim 12, wherein said alpha-tantalum layer is deposited using standard sputtering techniques.

19. A method in accordance with claim 12, wherein said alpha-tantalum layer is deposited using reactive ion deposition sputtering techniques.

20. A method in accordance with claim 12, wherein said tantalum nitride layer has a thickness within the range of about 10 Å to about 300 Å.

21. A method in accordance with claim 12, of producing a semiconductor structure comprising a barrier layer underlying a copper seed layer, including an additional step:
(c) depositing a sputtered seed layer of copper over a surface of said barrier layer, wherein steps (a) and (b) are carried out in a first chamber of a multi-chamber processing system, and step (c) is carried out in a second chamber of said multi-chamber processing system.

22. A method of depositing a tantalum nitride/alpha-tantalum-comprising barrier layer over a semiconductor substrate surface, comprising the steps of:
(a) depositing a layer of tantalum nitride over a semiconductor substrate surface using reactive ion deposition sputtering techniques;
(b) producing a $Ta_N$ seed layer over said tantalum nitride layer, wherein said $Ta_N$ seed layer is capable of inducing the formation of alpha-tantalum when tantalum is deposited over said $Ta_N$ seed layer, wherein said $Ta_N$ seed layer is produced by:
controlling an energy level of high energy species bombarding a tantalum nitride film surface; and
controlling an amount of tantalum sputter deposited over said tantalum nitride surface during said bombardment of said tantalum nitride film surface by said high energy species, so that a seed layer of $Ta_N$ is formed which contains between about 5 atomic % and about 33 atomic % nitrogen.

23. A method in accordance with claim 22, wherein said method further comprises continued deposition of tantalum over said $Ta_N$ seed layer to provide a tantalum nitride/$Ta_N$/alpha-tantalum barrier layer.

24. A method in accordance with claim 22, wherein said $Ta_N$ seed layer has a thickness within the range of about 2 Å to about 100 Å.

25. A method in accordance with claim 24, wherein said $Ta_N$ seed layer has a thickness within the range of about 20 Å to about 100 Å.

26. A method in accordance with claim 22, wherein said alpha-tantalum layer has a thickness of about 60 Å or less.

27. A method in accordance with claim 26, wherein said alpha-tantalum layer has a thickness of greater than about 5 Å.

28. A method in accordance with claim 22, wherein said alpha-tantalum layer is deposited using standard sputtering techniques.

29. A method in accordance with claim 22, wherein said alpha-tantalum layer is deposited using reactive ion deposition sputtering techniques.

30. A method in accordance with claim 22, wherein said TaN layer has a thickness within the range of about 10 Å to about 300 Å.

31. A method in accordance with claim 22, of producing a semiconductor structure comprising a barrier layer underlying a copper seed layer, including an additional step:
(c) depositing a sputtered seed layer of copper over a surface of said barrier layer, wherein steps (a) and (b) are carried out in a first chamber of a multi-chamber processing system, and step (c) is carried out in a second chamber of said multi-chamber processing system.

32. A method of depositing a tantalum/alpha-tantalum-comprising barrier layer over a semiconductor substrate surface, comprising the steps of:
(a) depositing a layer of tantalum over a semiconductor substrate surface using chemical vapor deposition;
(b) producing a $Ta_N$ seed layer over said tantalum layer, wherein said $Ta_N$ seed layer is capable of inducing the formation of alpha-tantalum when tantalum is deposited over said $Ta_N$ seed layer, wherein said $Ta_N$ seed layer is produced by:

controlling an energy level of high energy species bombarding a tantalum film surface; and controlling an amount of nitrogen present in a plasma used to bombard said tantalum film surface, so that a seed layer of $Ta_N$ is formed which contains between about 5 atomic % and about 33 atomic % nitrogen.

33. A method in accordance with claim 32, wherein said method further comprises a deposition of tantalum over said $Ta_N$ seed layer to provide a tantalum/$Ta_N$/alpha-tantalum barrier layer.

34. A method in accordance with claim 32, wherein said $Ta_N$ seed layer has a thickness within the range of about 2 Å to about 100 Å.

35. A method in accordance with claim 34, wherein said $Ta_N$ seed layer has a thickness within the range of about 20 Å to about 100 Å.

36. A method in accordance with claim 32, wherein said alpha-tantalum layer has a thickness of about 60 Å or less.

37. A method in accordance with claim 36, wherein said alpha-tantalum layer has a thickness of greater than about 5 Å.

38. A method in accordance with claim 32, wherein said alpha-tantalum layer is deposited using standard sputtering techniques.

39. A method in accordance with claim 32, wherein said alpha-tantalum layer is deposited using reactive ion deposition sputtering techniques.

40. A method in accordance with claim 32, of producing a semiconductor structure comprising a barrier layer underlying a copper seed layer, including an additional step:

(c) depositing a sputtered seed layer of copper over a surface of said barrier layer, wherein steps (a) and (b) are carried out in a first chamber of a multi-chamber processing system, and step (c) is carried out in a second chamber of said multi-chamber processing system.

41. A method of depositing a tantalum/alpha-tantalum-comprising barrier layer over a semiconductor substrate surface, comprising the steps of:

(a) depositing a layer of tantalum over a semiconductor substrate surface using standard sputtering techniques;

(b) producing a $Ta_N$ seed layer over said tantalum layer, wherein said $Ta_N$ seed layer is capable of inducing the formation of alpha-tantalum when tantalum is deposited over said $Ta_N$ seed layer, wherein said $Ta_N$ seed layer is produced by:

controlling an energy level of high energy species bombarding a tantalum nitride film surface; and controlling an amount of nitrogen present in a plasma used to bombard said tantalum film surface, so that a seed layer of $Ta_N$ is formed which contains between about 5 atomic % and about 33 atomic % nitrogen.

42. A method in accordance with claim 41, wherein said method further comprises a deposition of tantalum over said $Ta_N$ seed layer to provide a tantalum/$Ta_N$/alpha-tantalum barrier layer.

43. A method in accordance with claim 41, wherein said $Ta_N$ seed layer has a thickness within the range of about 2 Å to about 100 Å.

44. A method in accordance with claim 43, wherein said $Ta_N$ seed layer has a thickness within the range of about 20 Å to about 100 Å.

45. A method in accordance with claim 41, wherein said alpha-tantalum layer has a thickness of about 60 Å or less.

46. A method in accordance with claim 45, wherein said alpha-tantalum layer has a thickness of greater than about 5 Å.

47. A method in accordance with claim 41, wherein said alpha-tantalum layer is deposited using standard sputtering techniques.

48. A method in accordance with claim 41, wherein said alpha-tantalum layer is deposited using reactive ion deposition sputtering techniques.

49. A method in accordance with claim 41, of producing a semiconductor structure comprising a barrier layer underlying a copper seed layer, including an additional step:

(c) depositing a sputtered seed layer of copper over a surface of said barrier layer, wherein steps (a) and (b) are carried out in a first chamber of a multi-chamber processing system, and step (c) is carried out in a second chamber of said multi-chamber processing system.

50. A method of depositing a titanium nitride-comprising barrier layer over a semiconductor substrate surface, comprising the steps of:

(a) depositing a layer of titanium nitride over a semiconductor substrate surface using a method selected from the group consisting of chemical vapor deposition, standard sputtering, and reactive ion deposition sputtering;

(b) producing a $Ti_N$ seed layer over said titanium nitride layer, wherein said $Ti_N$ seed layer is produced by:

controlling an energy level of high energy species bombarding a titanium nitride film surface; and controlling an amount of titanium sputter deposited over said titanium nitride surface during said bombardment of said titanium nitride film surface by said high energy species, so that a seed layer of $Ti_N$ is formed which contains between about 5 atomic % and about 33 atomic % nitrogen.

51. A method in accordance with claim 50, of producing a semiconductor structure comprising a barrier layer underlying a copper seed layer, including an additional step:

(c) depositing a sputtered seed layer of copper over a surface of said barrier layer, wherein steps (a) and (b) are carried out in a first chamber of a multi-chamber processing system, and step (c) is carried out in a second chamber of said multi-chamber processing system.

52. A method of depositing a tungsten nitride-comprising barrier layer over a semiconductor substrate surface, comprising the steps of:

(a) depositing a layer of tungsten nitride over a semiconductor substrate surface using a method selected from the group consisting of chemical vapor deposition, standard sputtering, and reactive ion deposition sputtering;

(b) producing a $W_N$ seed layer over said tungsten nitride layer, wherein said $W_N$ seed layer is produced by:

controlling an energy level of high energy species bombarding a tungsten nitride film surface; and controlling an amount of tungsten sputter deposited over said tungsten nitride surface during said bombardment of said tungsten nitride film surface by said high energy species, so that a seed layer of $W_N$ is formed which contains between about 5 atomic % and about 33 atomic % nitrogen.

53. A method in accordance with claim 52, of producing a semiconductor structure comprising a barrier layer underlying a copper seed layer, including an additional step:

(c) depositing a sputtered seed layer of copper over a surface of said barrier layer, wherein steps (a) and (b) are carried out in a first chamber of a multi-chamber processing system, and step (c) is carried out in a second chamber of said multi-chamber processing system.

54. A method of depositing a molybdenum nitride-comprising barrier layer over a semiconductor substrate surface, comprising the steps of:
(a) depositing a layer of molybdenum nitride over a semiconductor substrate surface using a method selected from the group consisting of chemical vapor deposition, standard sputtering, and reactive ion deposition sputtering;
(b) producing a $Mo_N$ seed layer over said molybdenum nitride layer, wherein said $Mo_N$ seed layer is produced by:
controlling an energy level of high energy species bombarding a molybdenum nitride film surface; and
controlling an amount of molybdenum sputter deposited over said molybdenum nitride surface during said bombardment of said molybdenum nitride film surface by said high energy species, so that a seed layer of $Mo_N$ is formed which contains between about 5 atomic % and about 33 atomic % nitrogen.

55. A method in accordance with claim 54, of producing a semiconductor structure comprising a barrier layer underlying a copper seed layer, including an additional step:
(c) depositing a sputtered seed layer of copper over a surface of said barrier layer, wherein steps (a) and (b) are carried out in a first chamber of a multi-chamber processing system, and step (c) is carried out in a second chamber of said multi-chamber processing system.

56. A method of depositing a tantalum nitride-comprising barrier layer over a semiconductor substrate surface, comprising the steps of:
(a) depositing a layer of tantalum nitride over a semiconductor substrate surface using a method selected from the group consisting of chemical vapor deposition, standard sputtering, and reactive ion sputtering deposition;
(b) converting from 50% by volume to 100% by volume of said tantalum nitride layer to a composition wherein the nitrogen content ranges between about 5 atomic % and about 33 atomic % nitrogen by:
controlling an energy level of high energy species bombarding said tantalum nitride layer surface; and
controlling an amount of tantalum sputter deposited over said tantalum nitride surface during said conversion of said tantalum nitride layer.

57. A method in accordance with claim 56, wherein an initial thickness of said layer of tantalum nitride prior to conversion ranges between 10 Å and 300 Å.

58. A method in accordance with claim 56, of producing a semiconductor structure comprising a barrier layer underlying a copper seed layer, including an additional step:
(c) depositing a sputtered seed layer of copper over a surface of said barrier layer, wherein steps (a) and (b) are carried out in a first chamber of a multi-chamber processing system, and step (c) is carried out in a second chamber of said multi-chamber processing system.

59. A method of depositing a titanium nitride-comprising barrier layer over a semiconductor substrate surface, comprising the steps of:
(a) depositing a layer of titanium nitride over a semiconductor substrate surface using a method selected from the group consisting of chemical vapor deposition, standard sputtering, and reactive ion sputtering deposition;
(b) converting from 50% by volume to 100% by volume of said titanium nitride layer to a composition wherein the nitrogen content ranges between about 5 atomic % and about 33 atomic % nitrogen by:
controlling an energy level of high energy species bombarding said titanium nitride layer surface; and
controlling an amount of titanium sputter deposited over said titanium nitride surface during said conversion of said titanium nitride layer.

60. A method in accordance with claim 59, wherein an initial thickness of said layer of titanium nitride prior to conversion ranges between 10 Å and 300 Å.

61. A method in accordance with claim 59, of producing a semiconductor structure comprising a barrier layer underlying a copper seed layer, including an additional step:
(c) depositing a sputtered seed layer of copper over a surface of said barrier layer, wherein steps (a) and (b) are carried out in a first chamber of a multi-chamber processing system, and step (c) is carried out in a second chamber of said multi-chamber processing system.

62. A method of depositing a tungsten nitride-comprising barrier layer over a semiconductor substrate surface, comprising the steps of:
(a) depositing a layer of tungsten nitride over a semiconductor substrate surface using a method selected from the group consisting of chemical vapor deposition, standard sputtering, and reactive ion sputtering deposition;
(b) converting from 50% by volume to 100% by volume of said tungsten nitride layer to a composition wherein the nitrogen content ranges between about 5 atomic % and about 33 atomic % nitrogen by:
controlling an energy level of high energy species bombarding said tungsten nitride layer surface; and
controlling an amount of tungsten sputter deposited over said tungsten nitride surface during said conversion of said tungsten nitride layer.

63. A method in accordance with claim 62, wherein an initial thickness of said layer of tungsten nitride prior to conversion ranges between 10 Å and 300 Å.

64. A method in accordance with claim 62, of producing a semiconductor structure comprising a barrier layer underlying a copper seed layer, including an additional step:
(c) depositing a sputtered seed layer of copper over a surface of said barrier layer, wherein steps (a) and (b) are carried out in a first chamber of a multi-chamber processing system, and step (c) is carried out in a second chamber of said multi-chamber processing system.

65. A method of depositing a molybdenum nitride-comprising barrier layer over a semiconductor substrate surface, comprising the steps of:
(a) depositing a layer of molybdenum nitride over a semiconductor substrate surface using a method selected from the group consisting of chemical vapor deposition, standard sputtering, and reactive ion sputtering deposition;

(b) converting from 50% by volume to 100% by volume of said molybdenum nitride layer to a composition wherein the nitrogen content ranges between about 5 atomic % and about 33 atomic % nitrogen by:
  controlling an energy level of high energy species bombarding said molybdenum nitride layer surface; and
  controlling an amount of molybdenum sputter deposited over said molybdenum nitride surface during said conversion of said molybdenum nitride layer.

66. A method in accordance with claim 65, wherein an initial thickness of said layer of molybdenum nitride prior to conversion ranges between 10 Å and 300 Å.

67. A method in accordance with claim 65, of producing a semiconductor structure comprising a barrier layer underlying a copper seed layer, including an additional step:

(c) depositing a sputtered seed layer of copper over a surface of said barrier layer, wherein steps (a) and (b) are carried out in a first chamber of a multi-chamber processing system, and step (c) is carried out in a second chamber of said multi-chamber processing system.

* * * * *